(12) United States Patent
Lee et al.

(10) Patent No.: US 12,094,815 B2
(45) Date of Patent: Sep. 17, 2024

(54) SEMICONDUCTOR STRUCTURE HAVING DIELECTRIC-ON-DIELECTRIC STRUCTURE AND METHOD FOR FORMING THE SEMICONDUCTOR STRUCTURE

(71) Applicant: TAIWAN SEMICONDUCTOR MANUFACTURING COMPANY, LTD., Hsinchu (TW)

(72) Inventors: Cheng-Chin Lee, Hsinchu (TW);
Shao-Kuan Lee, Hsinchu (TW);
Hsin-Yen Huang, Hsinchu (TW);
Hsiao-Kang Chang, Hsinchu (TW);
Shau-Lin Shue, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 429 days.

(21) Appl. No.: 17/460,824

(22) Filed: Aug. 30, 2021

(65) Prior Publication Data
US 2023/0064448 A1 Mar. 2, 2023

(51) Int. Cl.
*H01L 23/522* (2006.01)
*H01L 21/768* (2006.01)

(52) U.S. Cl.
CPC .... *H01L 23/5226* (2013.01); *H01L 21/76831* (2013.01); *H01L 21/76843* (2013.01)

(58) Field of Classification Search
CPC ........... H01L 23/5226; H01L 21/76897; H01L 21/76834; H01L 21/76831; H01L 21/76843; H01L 21/76849; H01L 21/76877; H01L 29/66545

See application file for complete search history.

(56) References Cited

U.S. PATENT DOCUMENTS

| | | | |
|---|---|---|---|
| 11,171,051 B1 * | 11/2021 | Fullam | H01L 21/76877 |
| 2008/0102599 A1 * | 5/2008 | Yang | H01L 21/76849 |
| | | | 257/E21.589 |
| 2008/0197499 A1 * | 8/2008 | Yang | H01L 21/76826 |
| | | | 438/627 |
| 2017/0162431 A1 * | 6/2017 | Ahn | H01L 21/31116 |
| 2019/0189508 A1 * | 6/2019 | Peethala | H01L 21/76856 |
| 2021/0035856 A1 * | 2/2021 | Tsai | H01L 21/76885 |
| 2021/0225774 A1 * | 7/2021 | Yang | H10N 50/80 |
| 2021/0249053 A1 * | 8/2021 | Yang | H10N 70/841 |

* cited by examiner

*Primary Examiner* — Jaehwan Oh
*Assistant Examiner* — John M Parker
(74) *Attorney, Agent, or Firm* — Birch, Stewart, Kolasch & Birch, LLP

(57) ABSTRACT

A semiconductor structure includes a substrate with a conductive structure thereon, a first dielectric layer, a conductive feature and a second dielectric layer. The substrate includes a conductive feature. The conductive feature is formed in the first dielectric layer, is electrically connected to the conductive feature. The second dielectric layer is formed on the first dielectric layer and is disposed adjacent to the conductive feature. The first dielectric layer and the second dielectric layer are made of different materials.

20 Claims, 33 Drawing Sheets

SEMICONDUCTOR STRUCTURE HAVING DIELECTRIC-ON-DIELECTRIC STRUCTURE AND METHOD FOR FORMING THE SEMICONDUCTOR STRUCTURE

BACKGROUND

The semiconductor integrated circuit (IC) industry has over the past decades experienced tremendous advancements and is still experiencing vigorous development. With the dramatic advances in IC design, new generations of ICs have smaller and more complex circuits. Damascene process, such as single damascene or dual damascene, is one of the techniques used for forming BEOL (back-end-of-line) interconnect structures. The interconnect structures play an important role in miniaturization and electrical performance of the new generations of ICs. Thus, the industry pays much attention on development of the interconnect structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
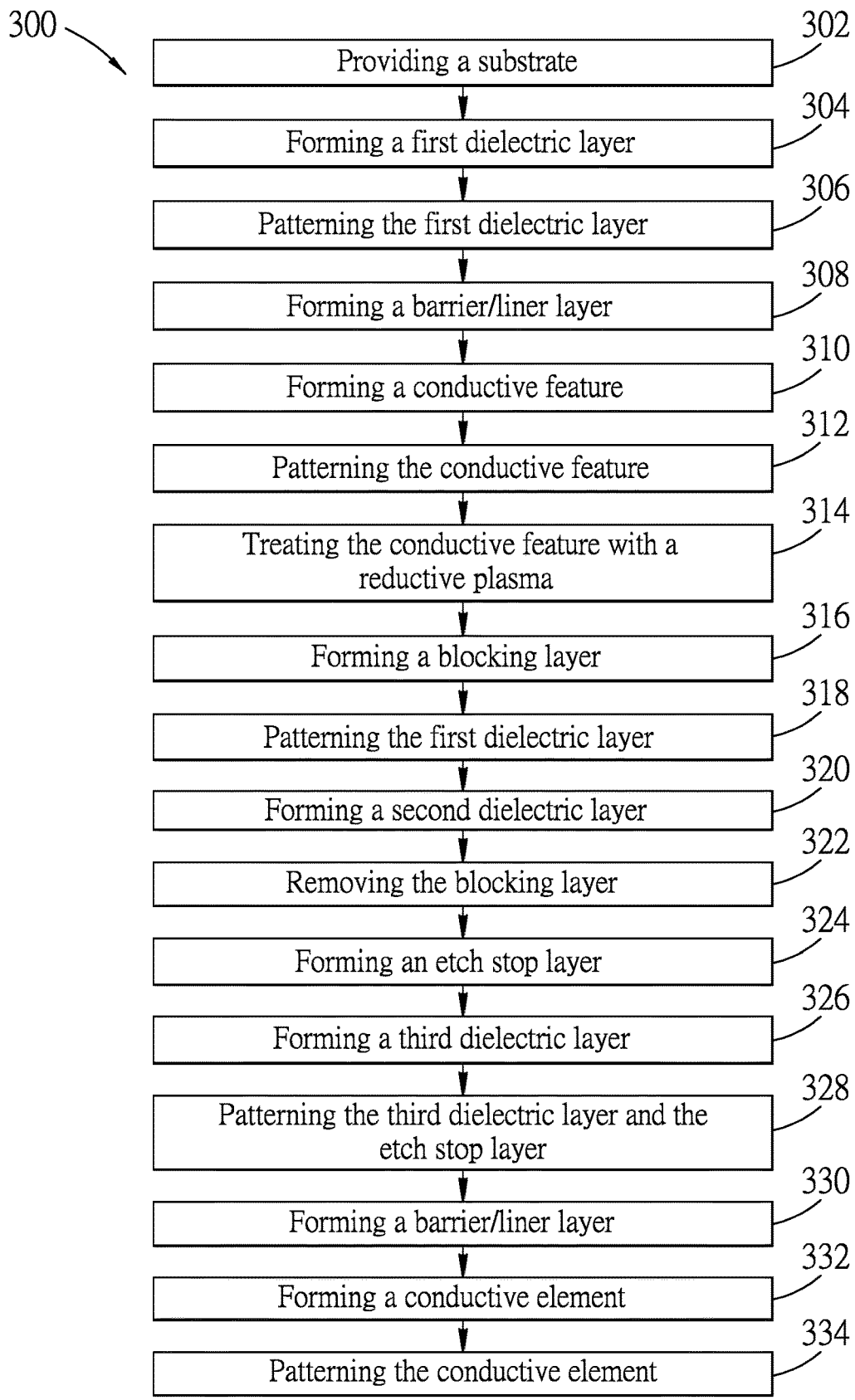
FIG. 1 illustrates a process flow for making a semiconductor structure in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 2 to 16 illustrate schematic views of intermediate steps in the formation of a semiconductor structure in accordance with some embodiments. The corresponding processes are also reflected in the flow chart 300 as shown in FIG. 1.

Figure 2:
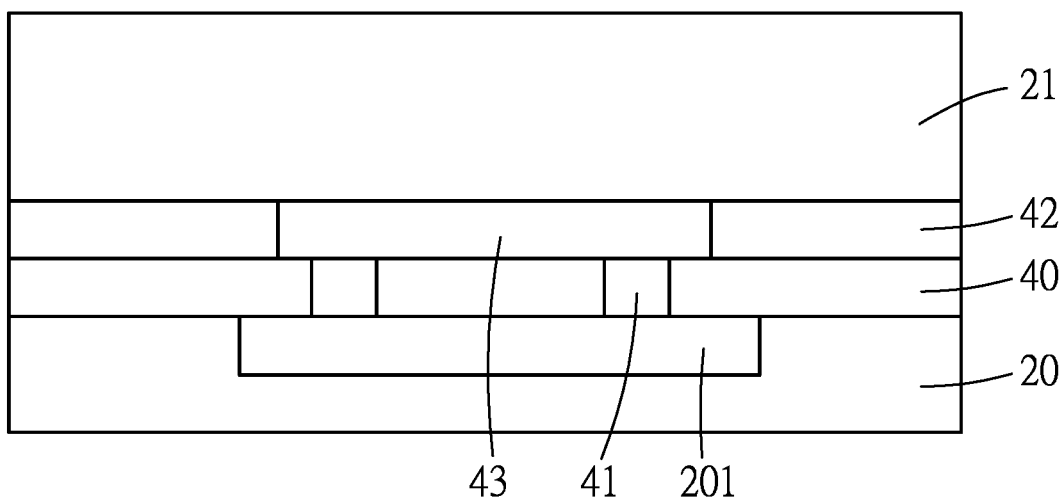
FIGS. 2 through 16 illustrate schematic views of stages in the formation of a semiconductor structure in accordance with some embodiments.

As shown in FIG. 2, in accordance with some embodiments, a substrate 20 is provided. This process is illustrated as process 302 in the flow chart 300 shown in FIG. 1. In some embodiments, the substrate 20 may be a semiconductor substrate, e.g., an elemental semiconductor or a compound semiconductor. An elemental semiconductor is composed of single species of atoms, such as silicon (Si) and germanium (Ge) in column IV of the periodic table. A compound semiconductor is composed of two or more elements, such as silicon carbide (SiC), gallium arsenide (GaAs), gallium phosphide (GaP), indium phosphide (InP), indium arsenide (InAs), indium antimonide (InSb), silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), gallium indium arsenide phosphide (GaInAsP), or the like. The compound semiconductor may have a gradient feature in which the composition changes from one ratio at one location to another ratio at another location in the compound semiconductor. The compound semiconductor may be formed over a silicon substrate. The compound semiconductor may be strained. In some embodiments, the substrate 20 may include a multilayer compound semiconductor structure. Alternatively, the substrate 20 may include a non-semiconductor material, such as a glass, fused quartz, or calcium fluoride. Furthermore, in some embodiments, the substrate 20 may be a semiconductor on insulator (SOI) (e.g., silicon germanium on insulator (SGOI)). Generally, an SOI substrate includes a layer of a semiconductor material such as epitaxial silicon (Si), germanium (Ge), silicon germanium (SiGe), or combinations thereof. The substrate 20 may be doped with a p-type dopant, such as boron (Br), aluminum (Al), gallium (Ga), or the like, or may alternatively be doped with an n-type dopant, as is known in the art. In some embodiments, the substrate 20 may include a doped epitaxial layer. Shallow trench isolation (STI) regions (not shown) may be formed in the substrate 20 to isolate active regions (only one is schematically shown in FIG. 2 with the numeral 201), such as source or drain regions of an integrated circuit device (not shown) in the substrate 20. In some embodiments, the integrated circuit device may include complementary metal-oxide semiconductor (CMOS) transistors, planar or vertical multi-gate transistors (e.g., FinFET devices), gate-all-around (GAA) devices, resistors, capacitors, diodes, transistors (e.g., field-effect transistors (FETs)), interconnections, or the like, based on practical applications. In addition, through-vias (not shown) may be formed to extend into the substrate 20 for electrically connecting features on opposite sides of the substrate 20.

In accordance with some embodiments, a dielectric layer 40 is formed over the substrate 20, and a contact feature 41 is formed in the dielectric layer 40 and is electrically connected to the active region 201.

In accordance with some embodiments, a dielectric layer 42 is formed over the dielectric layer 40, and a conductive structure 43 is formed in the dielectric layer 42 and is electrically connected to the contact feature 41. In some embodiments, the conductive structure 43 may be a metal interconnect line, and may be made of copper (Cu), cobalt (Co), tungsten (W), ruthenium (Ru), molybdenum (Mo), aluminum (Al), or the like. In some embodiments, the conductive structure 43 may be formed by physical vapor deposition (PVD), chemical vapor deposition (CVD), atomic layer deposition (ALD), electroless deposition (ELD), a combination of PVD and electrochemical plating (ECP), or the like.

In accordance with some embodiments, subsequent to the provision of the substrate 20, a first dielectric layer 21 is formed over the substrate 20. This process is illustrated as process 304 in the flow chart 300 shown in FIG. 1. In some embodiments, the first dielectric layer 21 is made of a low-K dielectric material. In some embodiment, the first dielectric layer 21 includes undoped silicate glass (USG), phosphosilicate glass (PSG), borosilicate glass (BSG), boron-doped phosphosilicate glass (BPSG), fluorine-doped silicate glass (FSG), silicon dioxide ($SiO_2$), SiOC-based materials (e.g., SiOCH), or the like. In some embodiments, silicon dioxide or SiOC-based materials may be formed from tetraethyl orthosilicate (TEOS). In some embodiments, the first dielectric layer 21 may be formed to be porous to lower the dielectric constant thereof. The first dielectric layer 21 may be formed using a suitable technique, such as spin-on coating, flowable chemical vapor deposition (FCVD), plasma enhanced CVD (PECVD), low pressure chemical vapor deposition (LPCVD), ALD, or the like.

Figure 3:
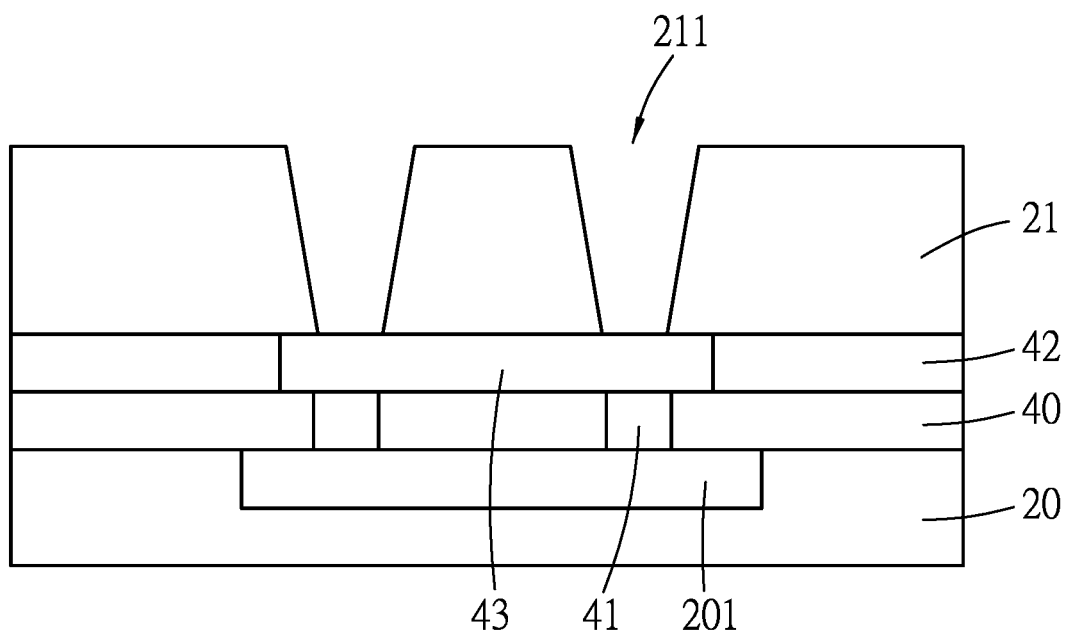

As shown in FIG. 3, in accordance with some embodiments, the first dielectric layer 21 is patterned to form at least one through hole 211. This process is illustrated as process 306 in the flow chart 300 shown in FIG. 1. In some embodiments, as shown in FIG. 3, the first dielectric layer 21 may be formed with two or more through holes 211 for subsequent electrical connection to different portions of the conductive structure 43. Alternatively, in accordance to some embodiments, two through holes 211 may be interconnected. Only one through hole 211 is described hereinafter for simplicity.

In accordance with some embodiments, a photoresist (not shown) may be used for patterning the first dielectric layer 21. The photoresist layer is first formed on the first dielectric layer 21, and is then patterned using a patterned mask. The photoresist may include a photosensitive material which undergoes a property change when exposed to light. The property change may be used to selectively remove exposed or unexposed portions of the photoresist in a photolithographic patterning process. In some embodiments, a photolithographic system exposes the photoresist to radiation. Radiation light passing through the patterned mask strikes the photoresist to thereby transfer a layout of the patterned mask to the photoresist. In some embodiments, the photoresist may be patterned using a direct writing or maskless lithographic technique, such as laser patterning, e-beam patterning, ion-beam patterning, or the like. After the exposure step, the photoresist is then developed, leaving the exposed portions of the photoresist, or in alternative examples, leaving the unexposed portions of the photoresist. In some embodiments, the patterning process may include multiple steps, such as soft baking of the photoresist, mask alignment, exposure, post-exposure baking, developing of the photoresist, rinsing, and drying (e.g., hard baking). Each of the steps may be repeated or omitted according to practical requirements. The patterned photoresist exposes portions of the first dielectric layer 21 to be etched. In some embodiments, the etching process may include an anisotropic (i.e., directional) etching configured to etch vertically through the first dielectric layer 21 without substantial horizontal etching. Accordingly, the etching process may include any suitable etching technique, such as dry etching, wet etching, reactive ion etching (RIE), ashing, or the like. The etching process may use any suitable etchant, and the particular etchant or etchants may depend on the materials of the first dielectric layer 21 being used.

Figure 4:
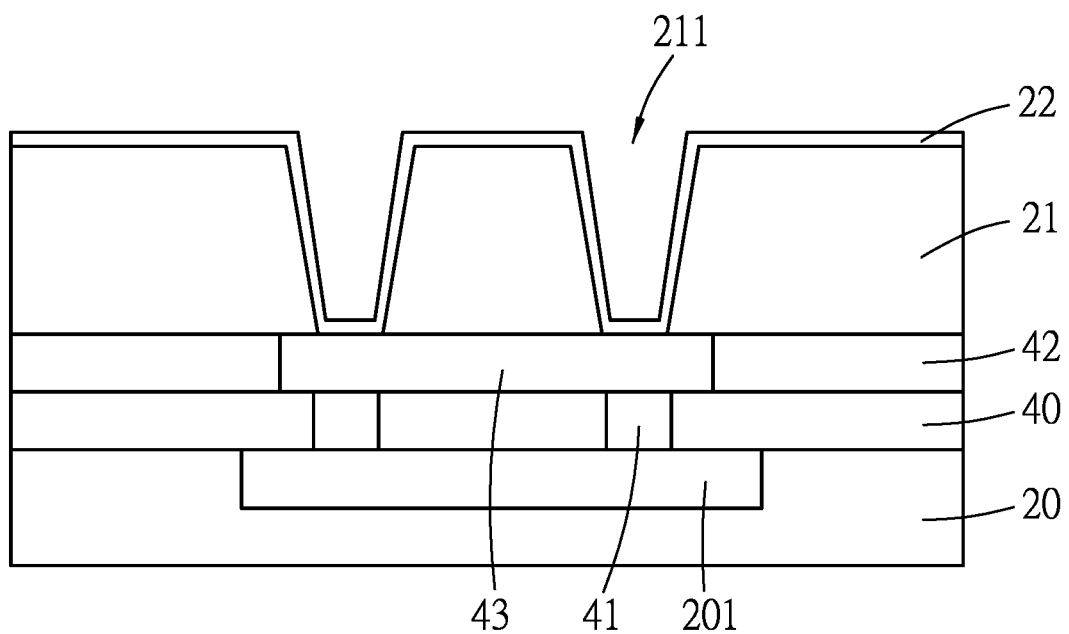

FIG. 4 illustrates that, after the first dielectric layer 21 is patterned to form the through hole 211, a barrier/liner layer 22 is conformally formed on the first dielectric layer 21 and in the through hole 211. This process is illustrated as process 308 in the flow chart 300 shown in FIG. 1. In some embodiments, the barrier/liner layer 22 includes a barrier and a liner. In some embodiments, the barrier of the barrier/liner layer 22 may include TaN, TiN, Ru, MnN, ZnO, MoN, or the like. In some embodiments, the liner of the barrier/liner layer 22 may include Ta, Ti, Co, Ru, or the like. In some embodiments, the barrier of the barrier/liner layer 22 may serve to prevent metal diffusion and exudation of a metal structure formed in later steps. In some embodiments, the liner of the barrier/liner layer 22 may serve to enhance adhesion of the metal structure formed in later steps to the barrier of the barrier/liner layer 22. In some embodiment, one of the liner and the barrier may be dispensed with. In some embodiments, the barrier/liner layer 22 may be dispensed with.

Figure 5:
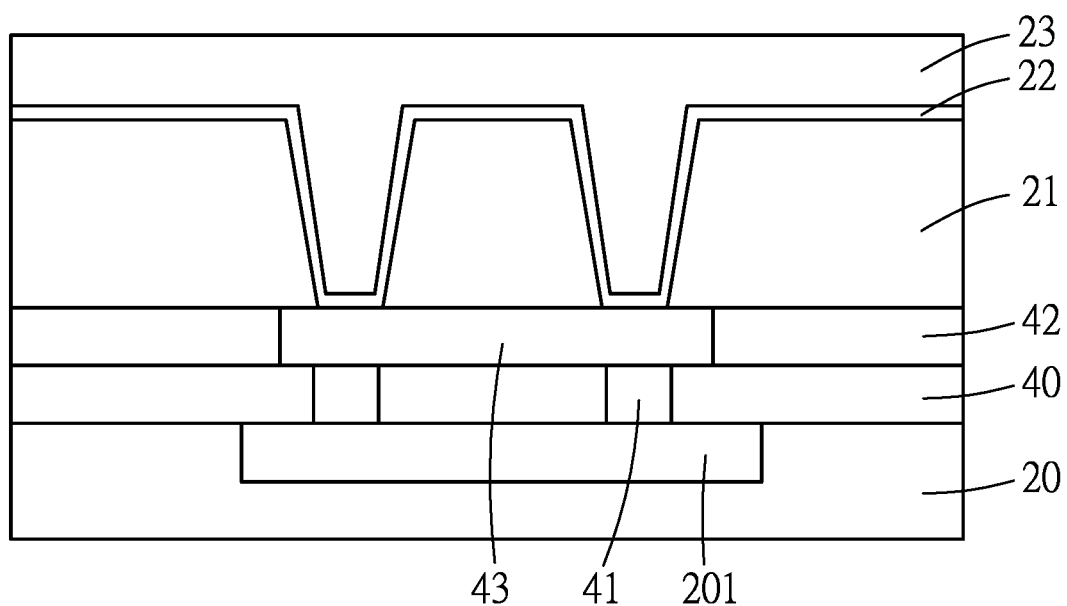

FIG. 5 illustrates that, after the formation of the barrier/liner layer 22, a conductive feature 23 is formed over the barrier/liner layer 22 to fill the through hole 211 (see FIG. 4). This process is illustrated as process 310 in the flow chart 300 shown in FIG. 1. In some embodiments, the conductive feature 23 may be made of metal including Co, Al, Cu, CuAl, CuMn, or the like, and may be formed by PVD, CVD, ALD, electroless deposition (ELD), a combination of PVD and electrochemical plating (ECP), or the like. In some embodiments in which the barrier/liner layer 22 is dispensed with, the conductive feature 23 is directly formed over the first dielectric layer 21 to fill the through hole 211 (see FIG. 4).

Figure 6:
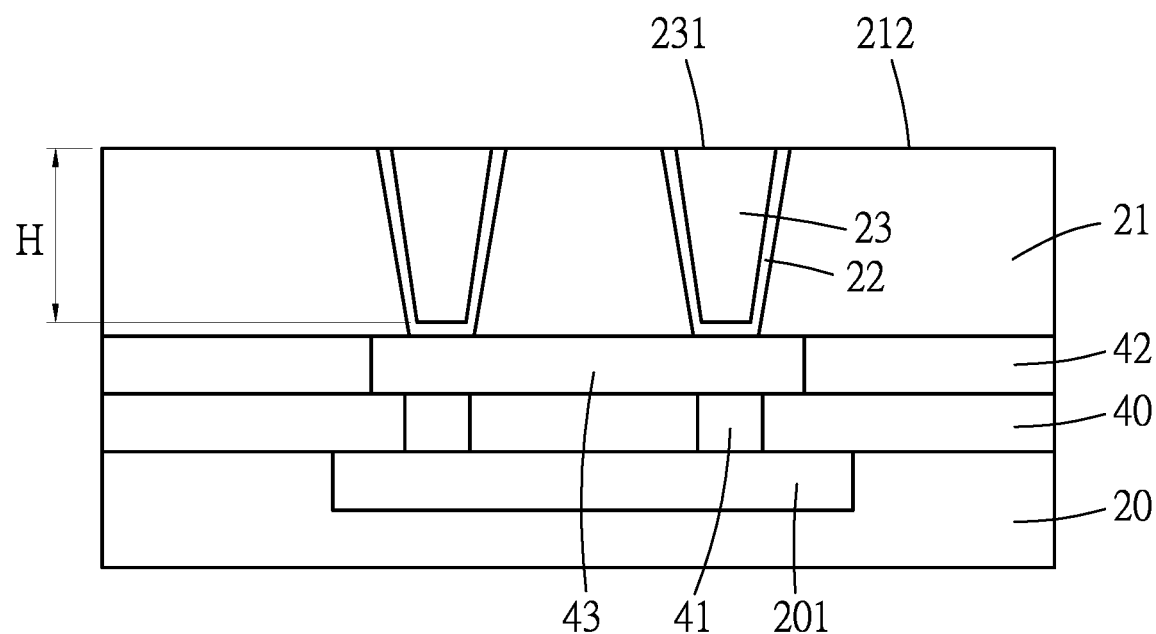

FIG. 6 illustrates that, after the formation of the conductive feature 23, the conductive feature 23 and the barrier/liner layer 22 are patterned. In some embodiments, a planarization process (e.g., chemical mechanical polish (CMP)) may be adopted to remove a portion of the conductive feature 23 and a portion of the barrier/liner layer 22 in excess. This process is illustrated as process 312 in the flow chart 300 shown in FIG. 1. In some embodiments, a top surface 231 of the conductive feature 23 is substantially flush with a top surface 212 of the first dielectric layer 21. In some embodiments, the patterned conductive feature 23 has a height (H) ranging from about 300 Å to about 1000 Å.

Figure 7:
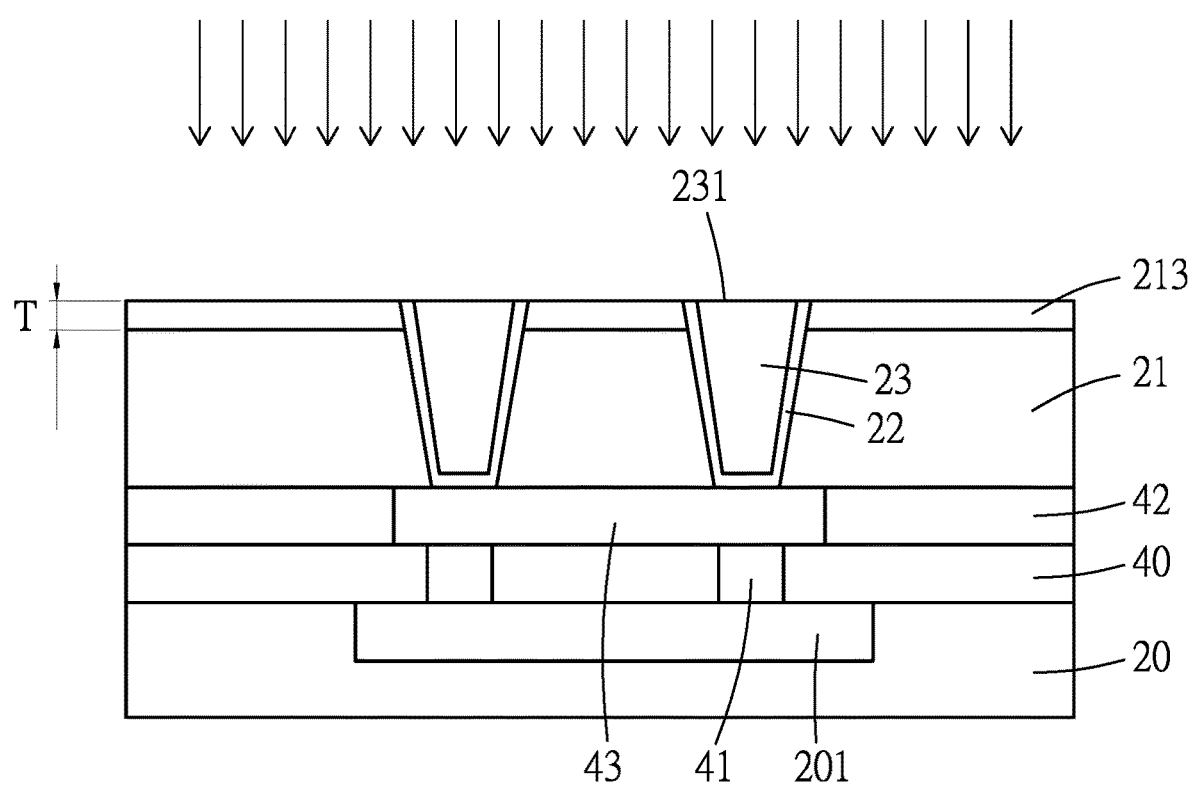

FIG. 7 illustrates that, after the patterning of the conductive feature 23, a plasma treatment may be applied to the conductive feature 23 and the first dielectric layer 21. This process is illustrated as process 314 in the flow chart 300 shown in FIG. 1. In some embodiments, after the previously mentioned planarization process, the top surface 231 of the conductive feature 23 may be covered with metal oxide and/or nitrogen-containing substances. In some embodiments, the metal oxide may be formed from oxidation of the conductive feature 23 during the CMP process. In some embodiments, the nitrogen-containing substances may be formed by the slurry used in the CMP process. In some embodiments, the metal oxide may have a thickness ranging from about 10 Å to about 20 Å. The plasma treatment may eliminate the nitrogen-containing substances, and may reduce the metal oxide into metal. In some embodiments, the plasma treatment involves the application of a reductive plasma, such as hydrogen-containing plasma, ammonia-containing plasma, alcohol-containing plasma, or the like. In some embodiments, the plasma treatment may be conducted under a temperature ranging from about 350° C. to about 400° C., and a pressure less than about 10 torr. In some embodiments, after the plasma treatment, a top portion of the first dielectric layer 21 may be formed into a plasma-damaged layer 213, which may have a thickness (T) ranging from about 20 Å to about 50 Å. In some embodiments, when the first dielectric layer 21 is made of SiOCH, the plasma-damaged layer 213 may be a silicon oxide based layer.

Figure 8:
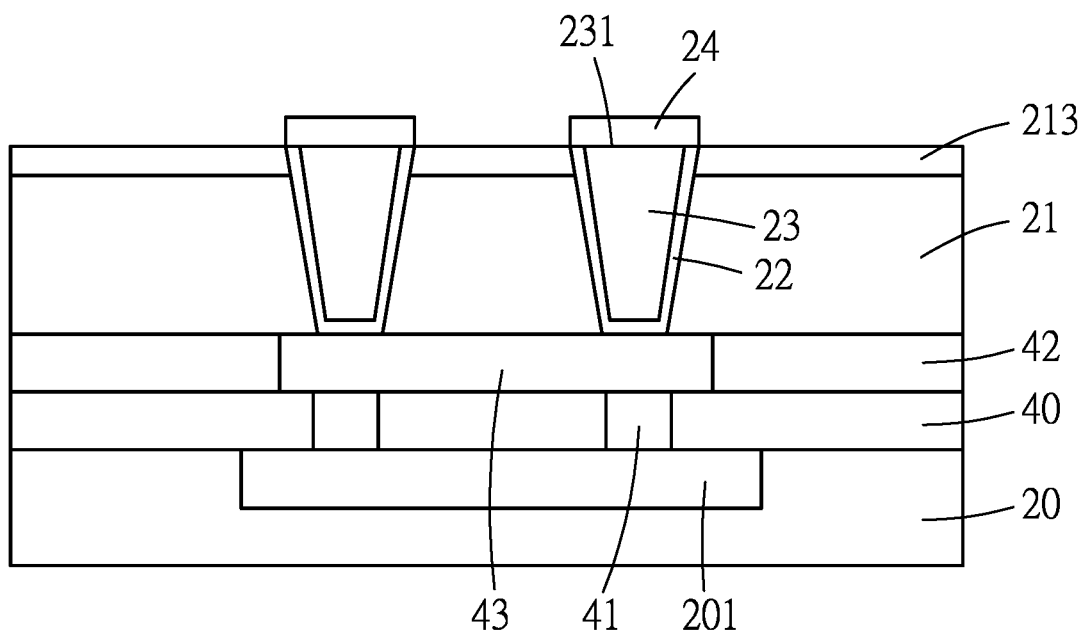

FIG. 8 illustrates that, after the plasma treatment, a blocking layer 24 is selectively formed on the top surface 231 of the conductive feature 23 to cover the top surface 231, and the blocking layer 24 is free from over the plasma-damaged layer 213. This process is illustrated as process 316 in the flow chart 300 shown in FIG. 1. In some embodiments, the blocking layer 24 may be formed from a self-assembling monolayer (SAM) material including a head group which contains phosphorus (P), sulfur (S), and/or nitrogen (N). In some embodiments, the head group of SAM may include phosphate, sulfate, and/or amine. In some embodiments, SAM further includes a tail group which is connected to the head group and which contains an organic chain, such as an alkyl chain or the like. In some embodiments, SAM including phosphorus may be a phosphonic acid-type SAM, which may be octadecylphosphonic acid (ODPA), bis(dodecyl)dithiophosphinic acid, decylphosphonic acid (DPA), tetradecylphosphonic acid (TPA), or the like, and may be selectively bonded to the conductive feature 23 made of cobalt. In some embodiments, SAM including sulfate may be a thiol-type SAM, which may be alkanethiol, propanethiol, butanethiol, hexanethiol, heptanethiol, octadecanethiol, nonanethiol, dodecanethiol, or the like, and may be selectively bonded to the conductive feature 23 made of copper. In some embodiments, SAM including nitrogen may be an amionoalkane-type SAM, which may be hexylamine, or the like. The blocking layer 24 may be formed by a suitable technique, such as ALD, molecular layer deposition (MLD), CVD, spin-on coating, dipping, or the like, and under a temperature below about 300° C. In some embodiments, the blocking layer 24 has a thickness ranging from about 20 Å to about 50 Å.

Figure 9:
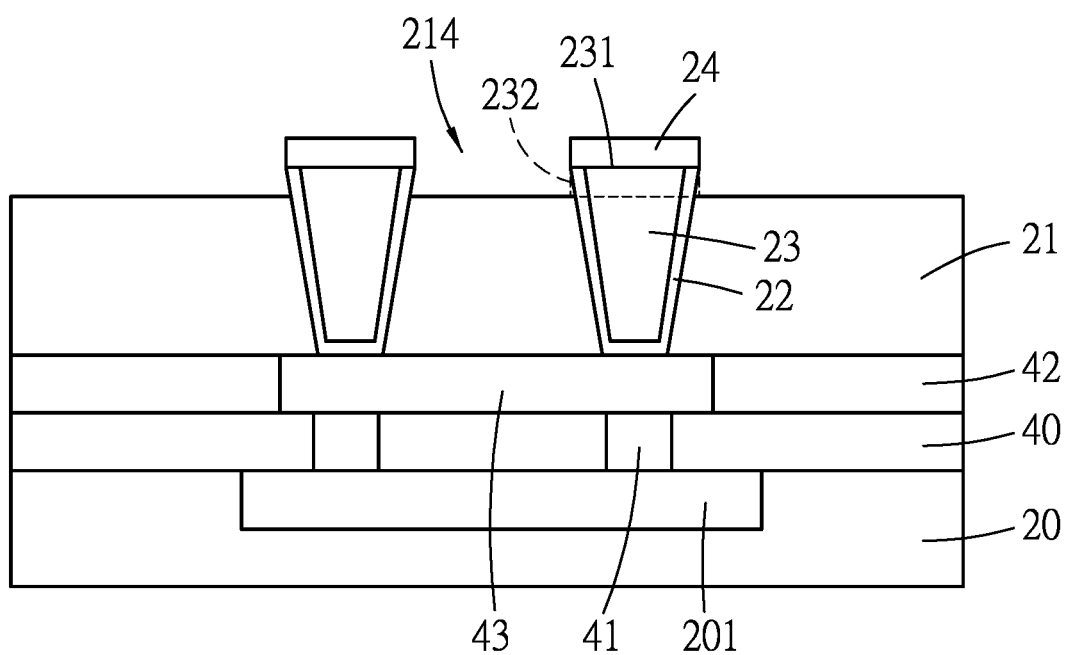

FIG. 9 illustrates that, after the formation of the blocking layer 24, the plasma-damaged layer 213 of the first dielectric layer 21 is removed. This process is illustrated as process 318 in the flow chart 300 shown in FIG. 1. In some embodiments, the plasma-damaged layer 213 (see FIG. 8) may be removed by suitable wet cleaning process, such as dipping, spin-on coating of etchant, or the like by using suitable etchant, such as diluted hydrofluoric (HF) acid, or the like to form a recess 214 adjoining the conductive feature 23. In some embodiments, the recess 214 surrounds and exposes a top portion 232 of the conductive feature 23, which has the top surface 231 of the conductive feature 23. In some embodiments, the recess 214 has a depth ranging from about 20 Å to about 50 Å. In some embodiments, the blocking layer 24 protects the conductive feature 23 from being damaged by the etchant.

Figure 10:
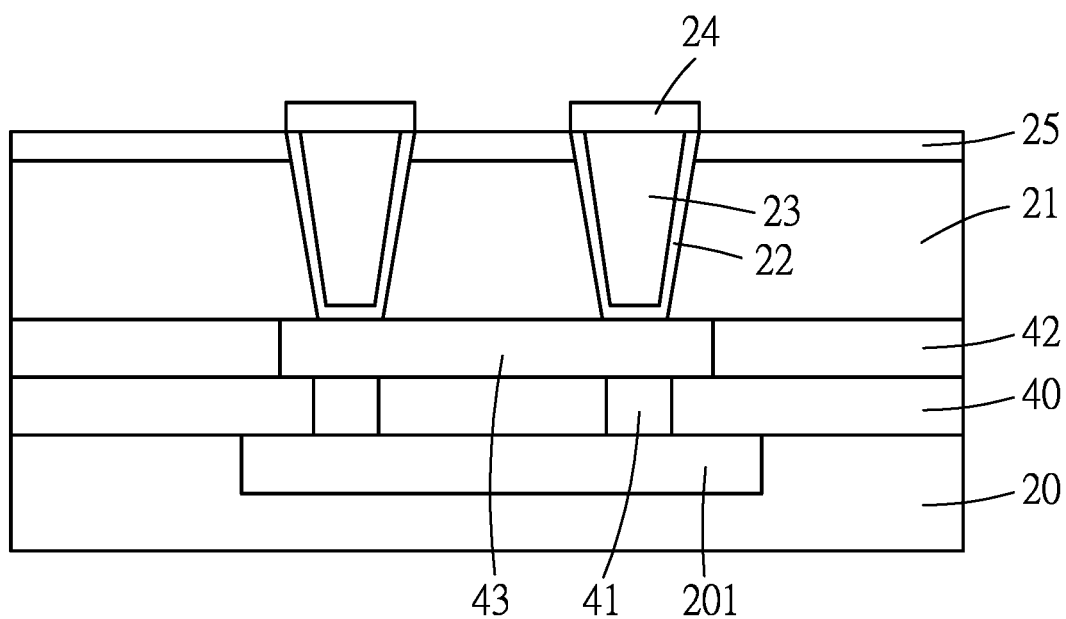

FIG. 10 illustrates that, after the removal of the plasma-damaged layer 213 of the first dielectric layer 21, a second dielectric layer 25 is selectively formed on the first dielectric layer 21 and not on the blocking layer 24. This process is illustrated as process 320 in the flow chart 300 shown in FIG. 1. In some embodiments, a precursor of the second dielectric layer 25 (e.g., ALD precursor) may have a terminal methyl group which has relative low affinity with (or even is repelled by) the tail group (e.g., the alkyl chain) of SAM of the blocking layer 24, and the second dielectric layer 25 is therefore only deposited on the first dielectric layer 21 and fills the recess 214 (see FIG. 9). In some embodiments, the second dielectric layer 25 may be made of a material selected from metal nitride, metal oxide, metal carbide, silicon nitride, silicon oxide, silicon carbide, and combinations thereof. In some embodiments, the second dielectric layer 25 may be made of aluminum oxide, aluminum nitride, hafnium oxide, hafnium nitride, silicon oxide, silicon nitride, or the like. The second dielectric layer 25 may be formed using a suitable technique, such as spin-on coating, FCVD, PECVD, LPCVD, ALD, or the like. In some embodiments, the first dielectric layer 21 and the second dielectric layer 25 may be made of different materials. In some embodiments, the second dielectric layer 25 may have a thickness ranging from about 20 Å to about 50 Å. In some embodiments, when the thickness of the blocking layer 24 is less than 20 Å, the blocking layer 24 may not be effective for repelling the precursor of the second dielectric layer 25, or not effective for preventing the second dielectric layer 25 from growing from the first dielectric layer 21 to partially cover the blocking layer 24. In some embodiments, when the thickness of the blocking layer 24 is more than 50 Å, it is no more effective than the thickness ranging from about 20 Å to about 50 Å in repelling the precursor of the second dielectric layer 25. As a result, a thickness of more than 50 Å may be a waste of SAM material.

Figure 11:
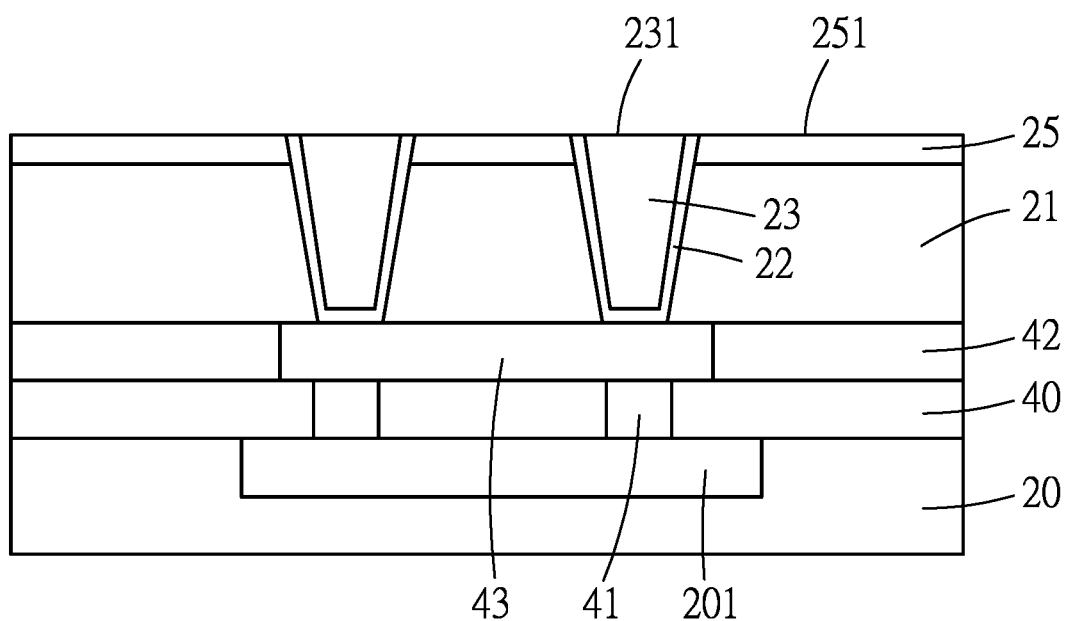

FIG. 11 illustrates that, after the formation of the second dielectric layer 25, the blocking layer 24 (see FIG. 10) is removed. This process is illustrated as process 322 in the flow chart 300 shown in FIG. 1. In some embodiments, the blocking layer 24 is removed by suitable techniques, such as direct or remote plasma treatments, which may include hydrogen and/or ammonia plasma. In some embodiment, a top surface 251 of the second dielectric layer 25 is substantially flush with the top surface 231 of the conductive feature 23. In some embodiments, the top surface 251 of the second dielectric layer 25 and the top surface 231 of the conductive feature 23 collectively form a continuous flat surface.

Figure 12:
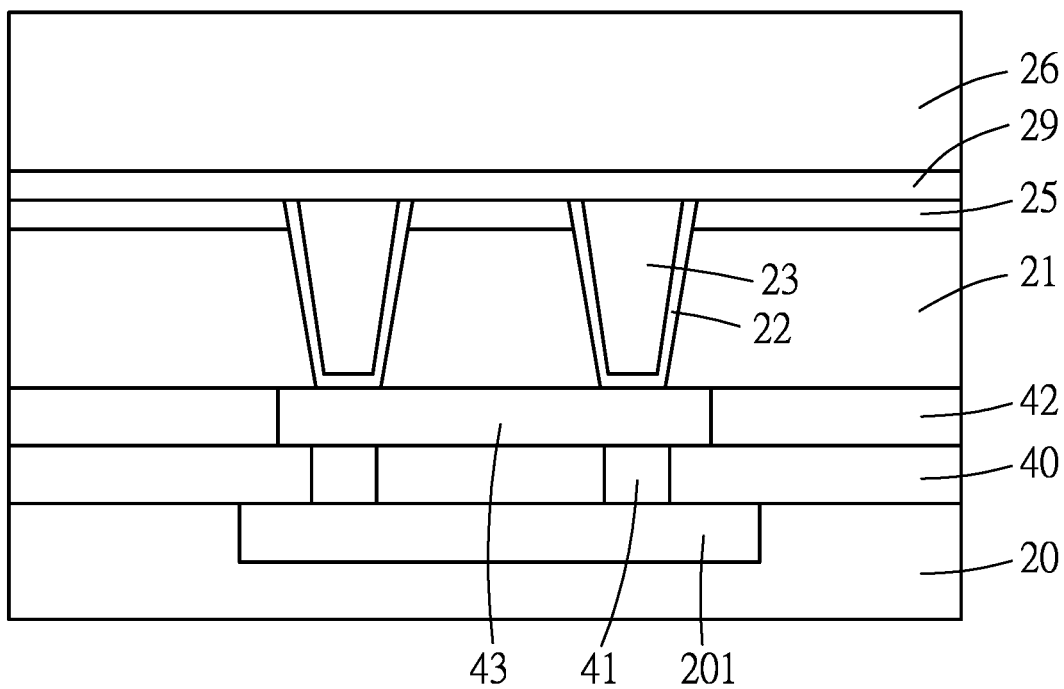

FIG. 12 illustrates that, after the removal of the blocking layer 24 (see FIG. 10), an etch stop layer 29 is formed over the conductive feature 23 and the second dielectric layer 25. This process is illustrated as process 324 in the flow chart 300 shown in FIG. 1. In some embodiments, the etch stop layer 29 may be made of aluminum-containing compounds (e.g., aluminum nitride, aluminum oxynitride, aluminum oxide, or the like), silicon-containing compounds (e.g., silicon oxycarbide, silicon carbonitride, silicon nitride, silicon oxycarbonitride, silicon oxide, silicon carbide, silicon oxynitride, or the like), combinations thereof, or the like. In some embodiments, the second dielectric layer 25 and the etch stop layer 29 may be made of different materials. In some embodiments, the etch stop layer 29 may have a thickness ranging from about 5 Å to about 500 Å. In some embodiments, the etch stop layer 29 may be formed by suitable techniques, such as CVD, PVD, ALD, or the like.

FIG. 12 further illustrates that, after the formation of the etch stop layer 29, a third dielectric layer 26 is formed over the etch stop layer 29. This process is illustrated as process 326 in the flow chart 300 shown in FIG. 1. In some embodiments, the third dielectric layer 26 is made of a low-K dielectric material. In some embodiments, the third dielectric layer 26 includes USG, PSG, BSG, BPSG, FSG, $SiO_2$, SiOC-based materials (e.g., SiOCH), or the like. In some embodiments, silicon dioxide or SiOC-based materials may be formed from TEOS. In some embodiments, the third dielectric layer 26 may be formed to be porous to lower the dielectric constant thereof. The third dielectric layer 26 may be formed using a suitable technique, such as spin-on coating, FCVD, PECVD, LPCVD, ALD, or the like. In some embodiments, the third dielectric layer 26 and the first dielectric layer 21 may be made of the same material. In some embodiments, the third dielectric layer 26 and the first dielectric layer 21 may be made of different materials. In some embodiments, the third dielectric layer 26, the etch stop layer 29 and the second dielectric layer 25 may be made of different materials.

Figure 13:
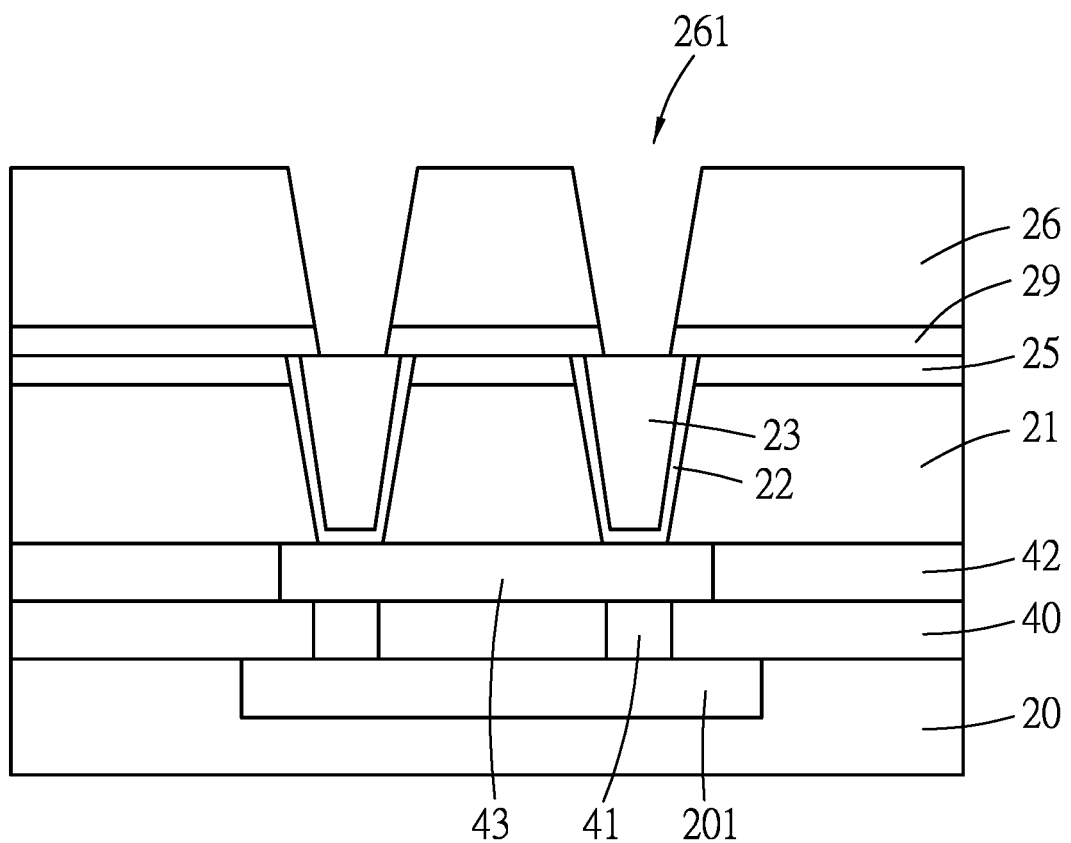

FIG. 13 illustrates that, after the formation of the third dielectric layer 26, the third dielectric layer 26 and the etch stop layer 29 are patterned to form a through hole 261. This process is illustrated as process 328 in the flow chart 300 shown in FIG. 1. In some embodiments, the conductive feature 23 may be a trench metal, and the through hole 261 may be a via hole formed by a single damascene etch process.

Figure 14:
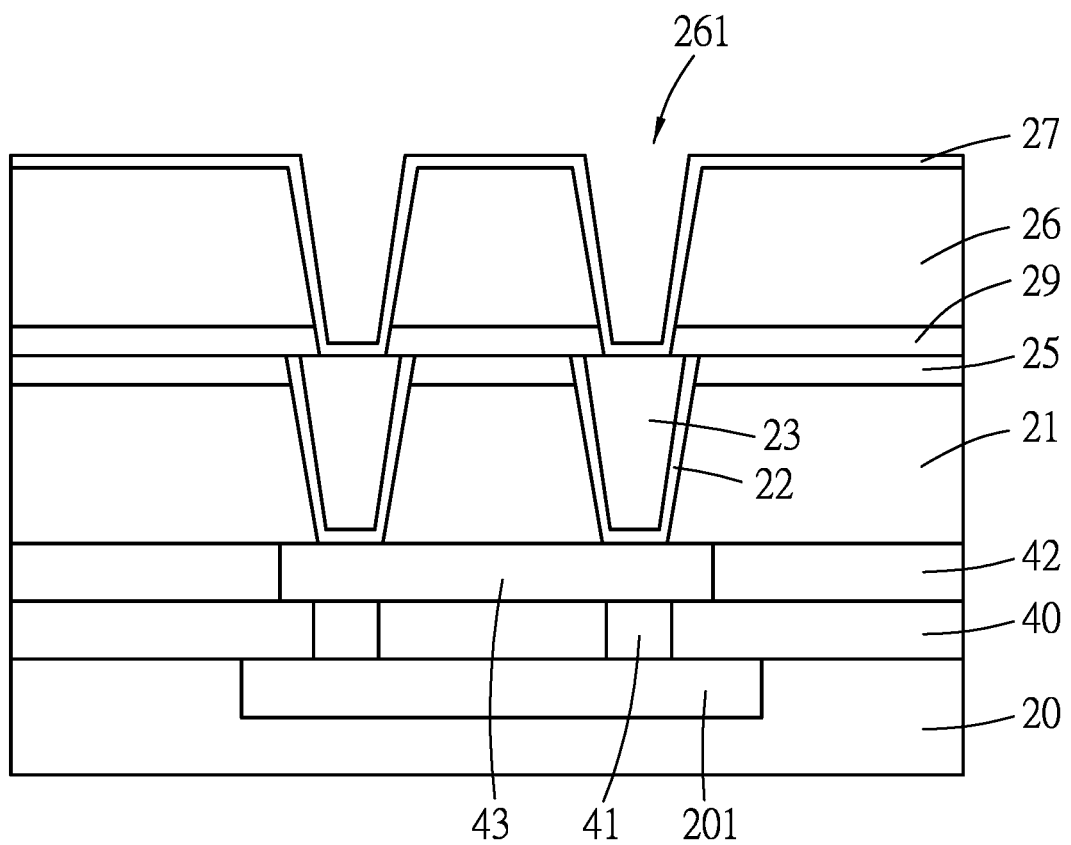

FIG. 14 illustrates that, after the third dielectric layer 26 and the etch stop layer 29 are patterned to form the through hole 261, a barrier/liner layer 27 is conformally formed on the third dielectric layer 26 and in the through hole 261. This process is illustrated as process 330 in the flow chart 300 shown in FIG. 1. In some embodiments, the barrier/liner layer 27 includes a barrier and a liner. In some embodiments, the barrier of the barrier/liner layer 27 may include TaN, TiN, Ru, MnN, ZnO, MoN, or the like. In some embodiments, the liner of the barrier/liner layer 27 may include Ta, Ti, Co, Ru, or the like. In some embodiments, the barrier of the barrier/liner layer 27 may serve to prevent metal diffusion and exudation of a metal structure formed in later steps. In some embodiments, the liner of the barrier/liner layer 27 may serve to enhance adhesion of the metal structure formed in later steps to the barrier of the barrier/liner layer 27. In some embodiment, one of the liner and the barrier may be dispensed with. In some embodiments, the barrier/liner layer 27 may be dispensed with.

Figure 15:
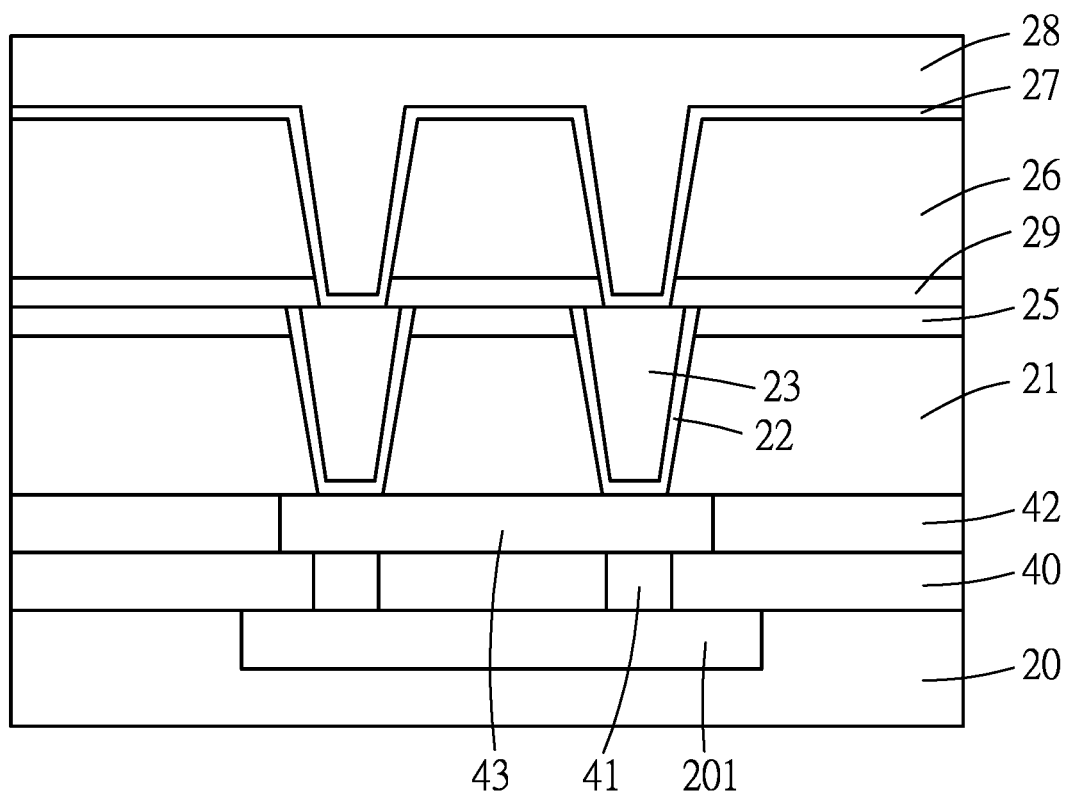

FIG. 15 illustrates that, after the formation of the barrier/liner layer 27, a conductive element 28 is formed over the barrier/liner layer 27 to fill the through hole 261 (see FIG. 14). This process is illustrated as process 332 in the flow chart 300 shown in FIG. 1. In some embodiments, the conductive element 28 may be made of metal including Co, Al, Cu, CuAl, CuMn, or the like, and may be formed by PVD, CVD, ALD, ELD, a combination of PVD and ECP, or the like. In some embodiments in which the barrier/liner layer 27 is dispensed with, the conductive element 28 is directly formed over the third dielectric layer 26 to fill the through hole 261 (see FIG. 14).

Figure 16:
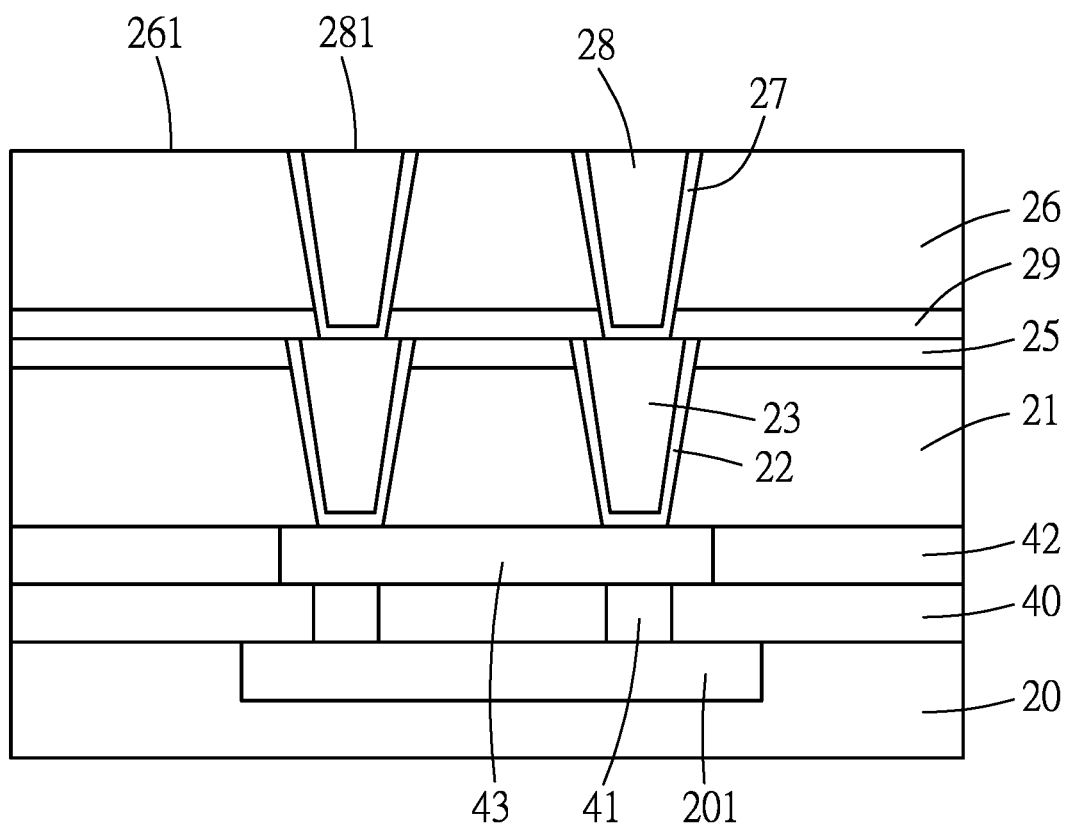

FIG. 16 illustrates that, after the formation of the conductive element 28, the conductive element 28 and the barrier/liner layer 27 are patterned. In some embodiments, a planarization process (e.g., chemical mechanical polish (CMP)) may be adopted to remove a portion of the conductive element 28 and a portion of the barrier/liner layer 27 in excess. This process is illustrated as process 334 in the flow chart 300 shown in FIG. 1. In some embodiments, a top surface 281 of the conductive element 28 is substantially flush with a top surface 261 of the third dielectric layer 26.

Figure 17:
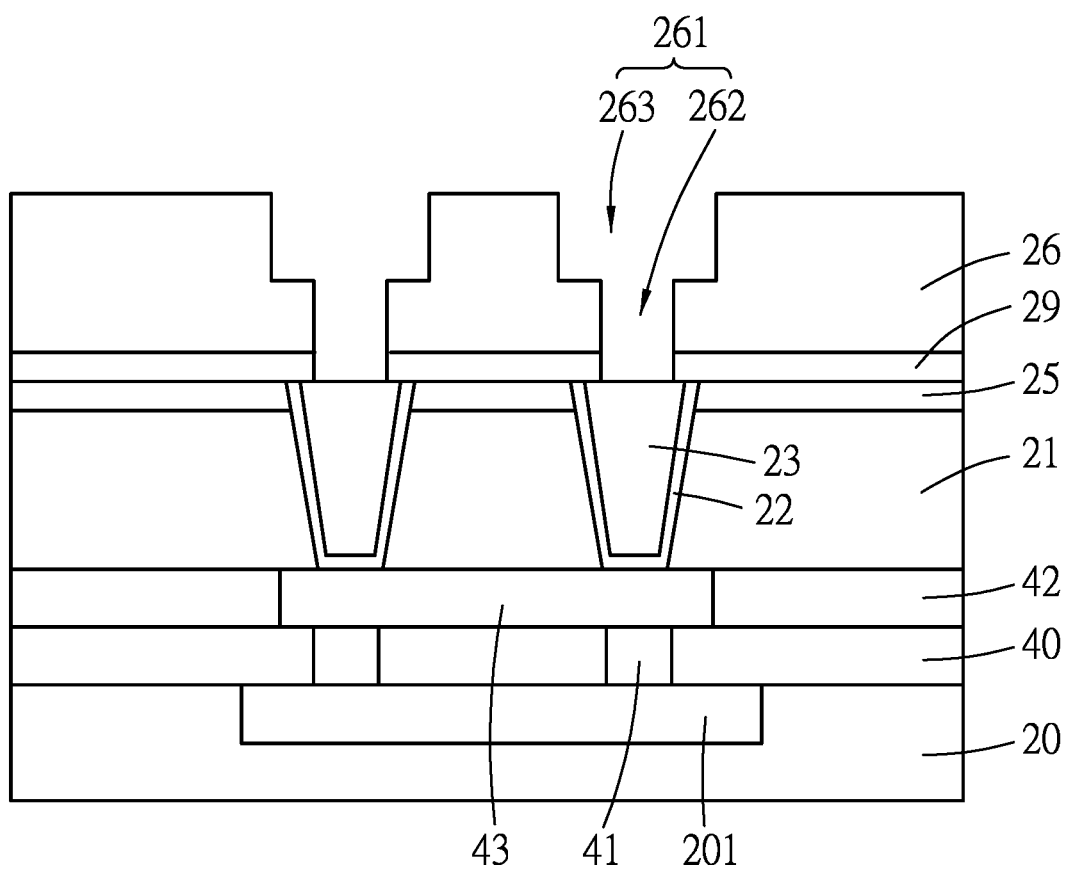
FIG. 17 illustrates an alternative to the structure depicted in FIG. 13 and a step 328 in the flow chart 300 of FIG. 1.
Figure 18:
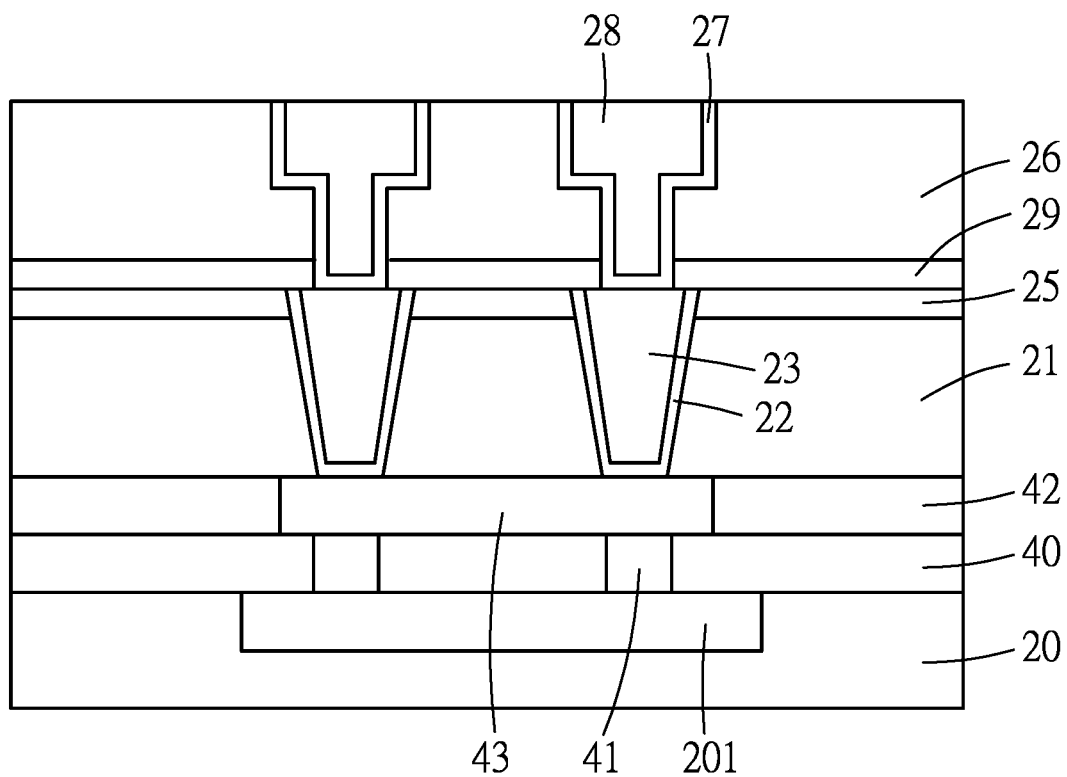
FIG. 18 illustrates an alternative to the structure depicted in FIG. 16.

FIG. 17 illustrates an alternative to the structure depicted in FIG. 13 and the process 328 in the flow chart 300 as shown in FIG. 1. In accordance with some embodiments, the third dielectric layer 26 and the etch stop layer 29 may be patterned to form the through hole 261, which includes a via 262 and a trench 263 that is spatially communicated with the via 262 and that has a width larger than that of the via 262. In some embodiments, such combination of the via 262 and the trench 263 may be formed by two separate single damascene etch processes, and, alternatively, the combination of the via 262 and the trench 263 may be formed by a dual damascene etch process. Referring to FIG. 18, after the formation of the through hole 261 of FIG. 17, processes 330 to 334 may be conducted to form the barrier/liner layer 27 and the conductive element 28. In some embodiments, according to practical requirements, one of the liner and the barrier may be dispensed with. Alternatively, the barrier/liner layer 27 may be dispensed with.

Figure 19:
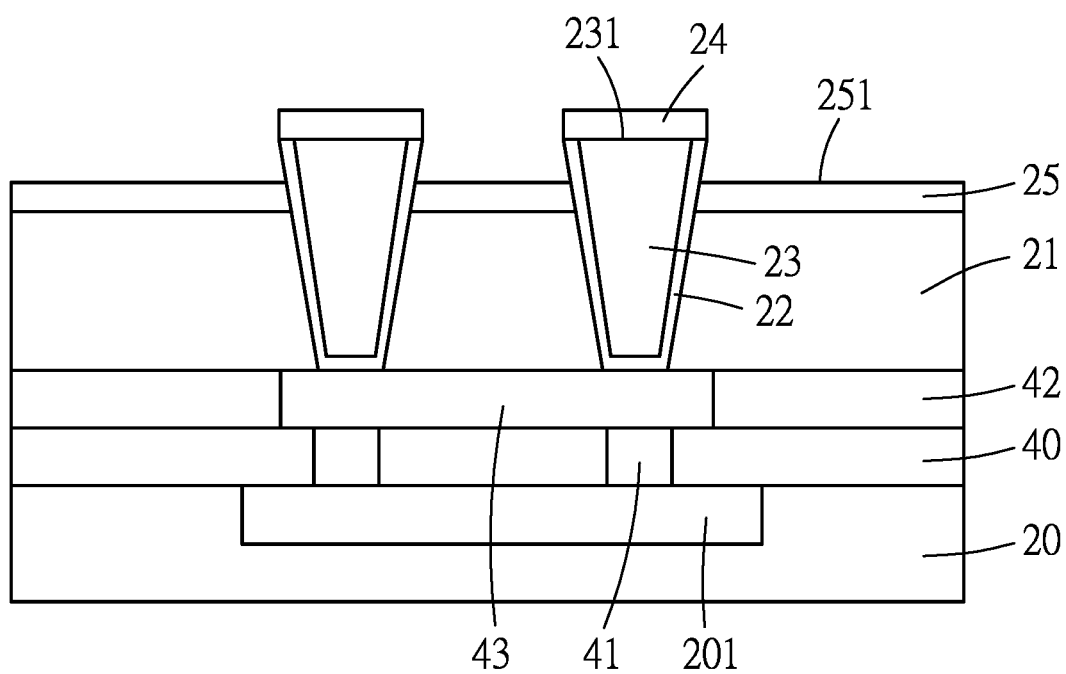
FIGS. 19 through 22 illustrate schematic views of stages in the formation of a semiconductor structure in accordance with some embodiments.

FIG. 19 illustrates an alternative to the structure depicted in FIG. 10 and the process 320 in the flow chart 300 as shown in FIG. 8. In some embodiments, the second dielectric layer 25 is formed in such a manner that the top surface 251 of the second dielectric layer 25 is lower than the top surface 231 of the conductive feature 23.

Figure 20:
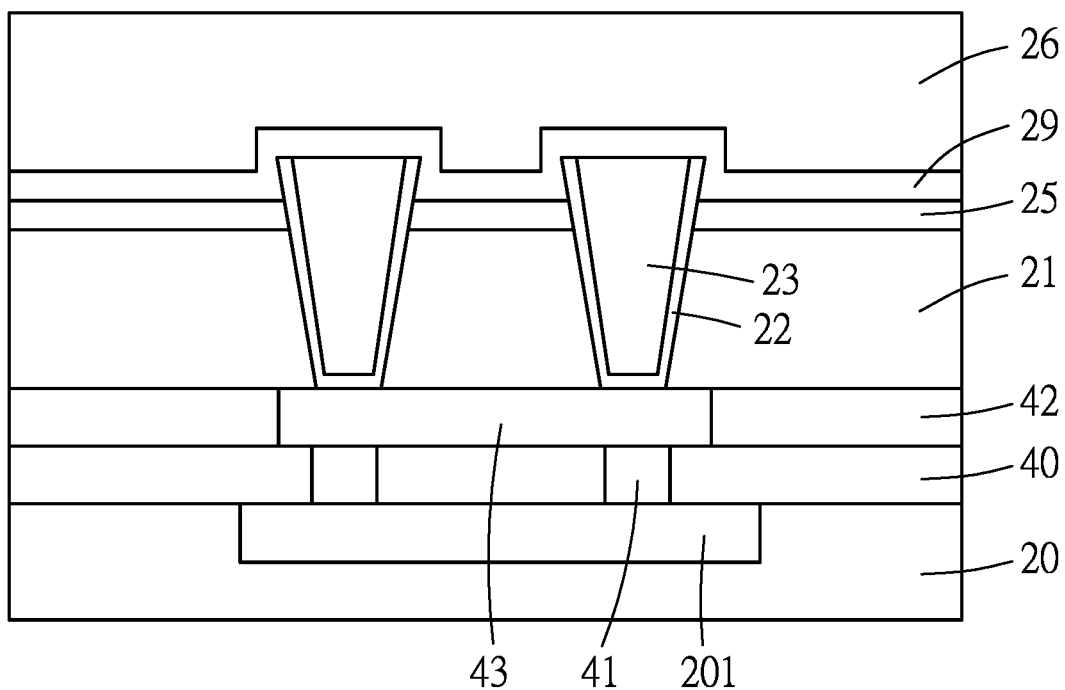

Referring to FIG. 20, after the second dielectric layer 25 is formed in FIG. 19, the blocking layer 24 (see FIG. 18) is removed, followed by forming the etch stop layer 29 over the conductive feature 23 and the second dielectric layer 25 and forming the third dielectric layer 26 over the etch stop layer 29.

Figure 21:
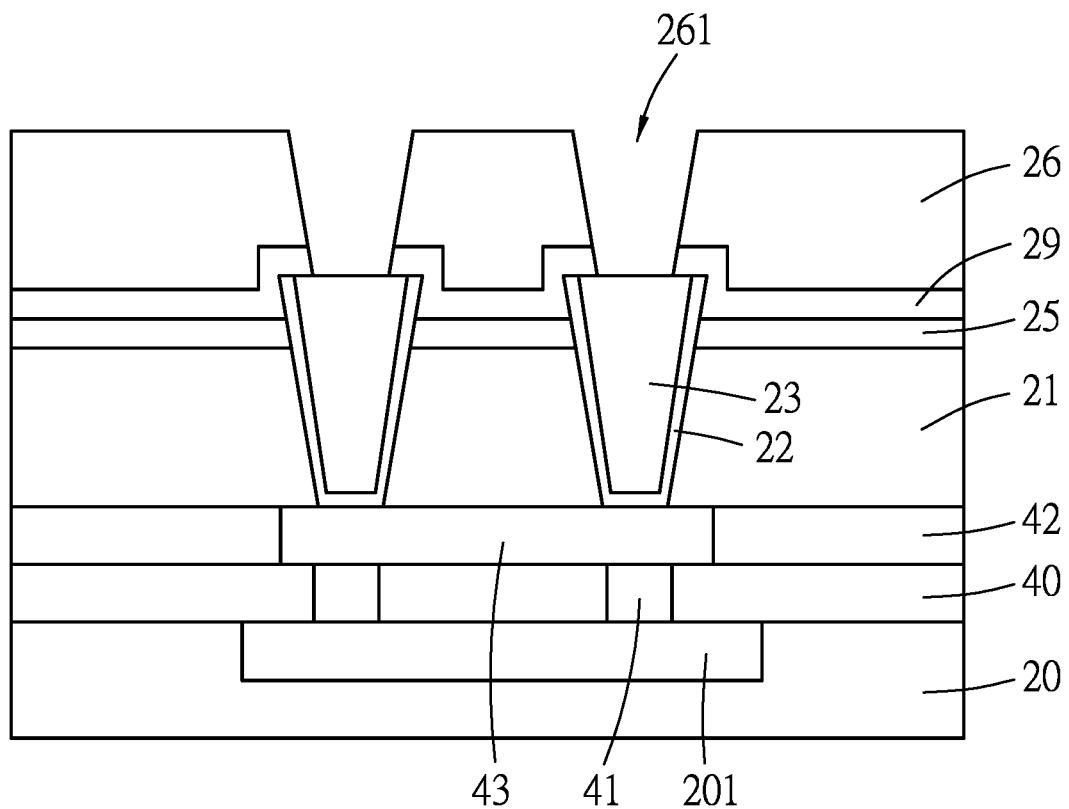
Figure 22:
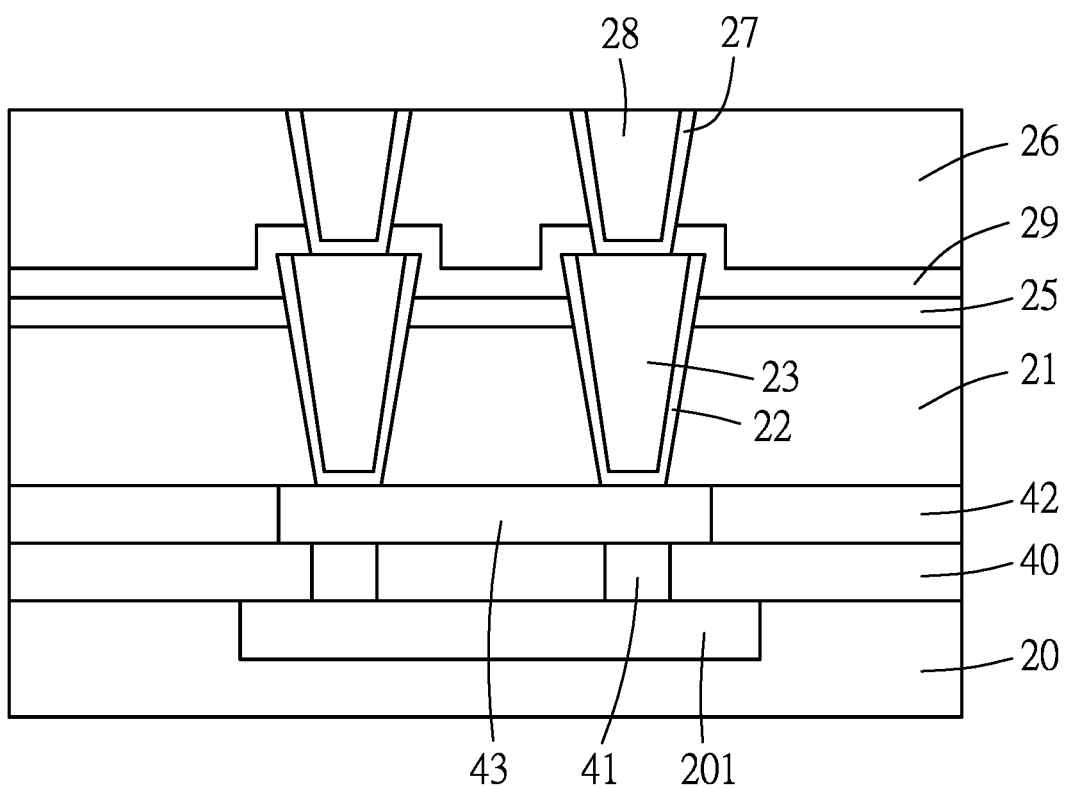

Referring to FIG. 21, after the formation of the etch stop layer 29 and the third dielectric layer 26, the third dielectric layer 26 and the etch stop layer 29 can then be patterned to form the through hole 261 with desired profile. Referring to FIG. 22, after the formation of the through hole 261 of FIG. 21, processes 330 to 334 may be conducted to form the barrier/liner layer 27 and the conductive element 28. In some embodiments, according to practical requirements, one of the liner and the barrier may be dispensed with. Alternatively, the barrier/liner layer 27 may be dispensed with.

Figure 23:
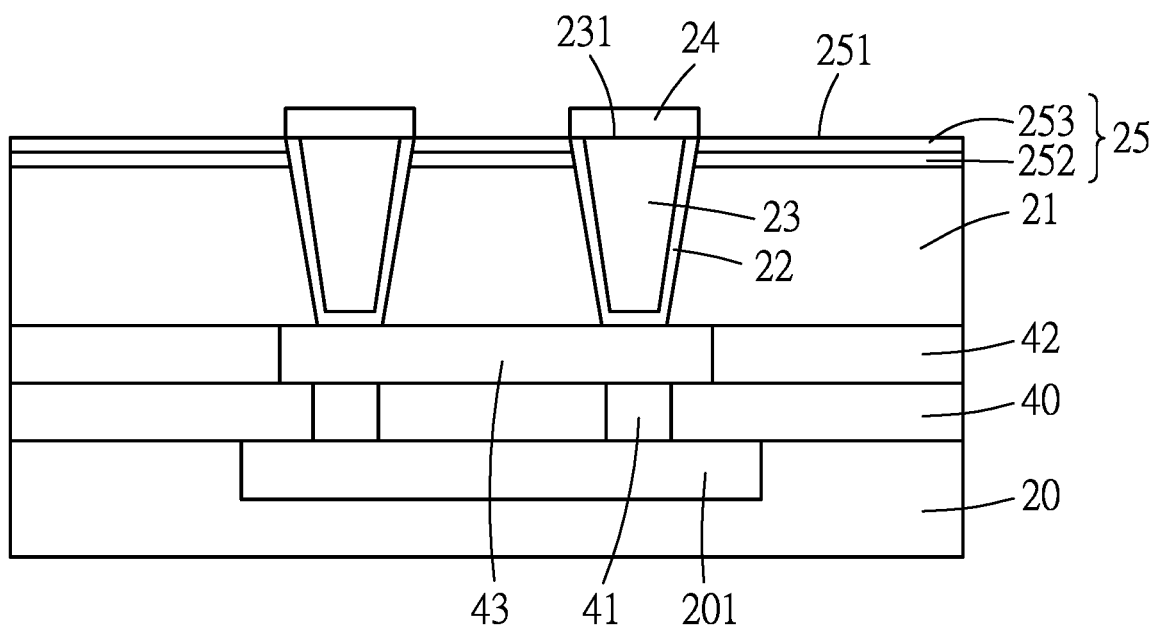
FIG. 23 through FIG. 26 illustrate schematic views of stages in the formation of a semiconductor structure in accordance with some embodiments.

FIG. 23 illustrates an alternative to the structure depicted in FIG. 10 and the process 320 in the flow chart 300 as shown in FIG. 1. In some embodiments, the second dielectric layer 25 is formed to include a first sub-layer 252 and a second sub-layer 253 disposed on the first sub-layer 252. In some embodiments, the second sub-layer 253 has the top surface 251 of the second dielectric layer 25, which may be substantially flush with the top surface 231 of the conductive feature 23. Alternatively, the top surface 251 of the second dielectric layer 25 may be lower than the top surface 231 of the conductive feature 23. In some embodiments, the first sub-layer 252 and the second sub-layer 253 are made of different dielectric materials, and each of the first sub-layer 252 and the second sub-layer 253 may be made of an oxide material or a nitride material. In some embodiments, each of the first sub-layer 252 and the second sub-layer 253 may be made of a material selected from metal nitride, metal oxide, metal carbide, silicon nitride, silicon oxide, silicon carbide, and combinations thereof. In some materials, the first sub-layer 252 and the second sub-layer 253 may be made of the same material. In some embodiments, the first sub-layer 252 and the second sub-layer 253 may be made of different materials. In some embodiments, the first sub-layer 252 may be made of a material that has good adhesion to the underlying first dielectric layer 21, and the second sub-layer 253 may be made of a material that has a dielectric constant lower than that of the first sub-layer 252. In some embodiments, the second sub-layer 253 may be made of a material that is more resistant to subsequent dielectric etch process than the first sub-layer 252. In some embodiments, the second sub-layer 253 may be made of aluminum oxide and the first sub-layer 252 may be made of silicon oxide. In some embodiments, the second sub-layer 253 may be made of zirconium oxide and the first sub-layer 252 may be made of silicon nitride. In some embodiments, the second dielectric layer 25 may contains more than two sub-layers.

Figure 24:
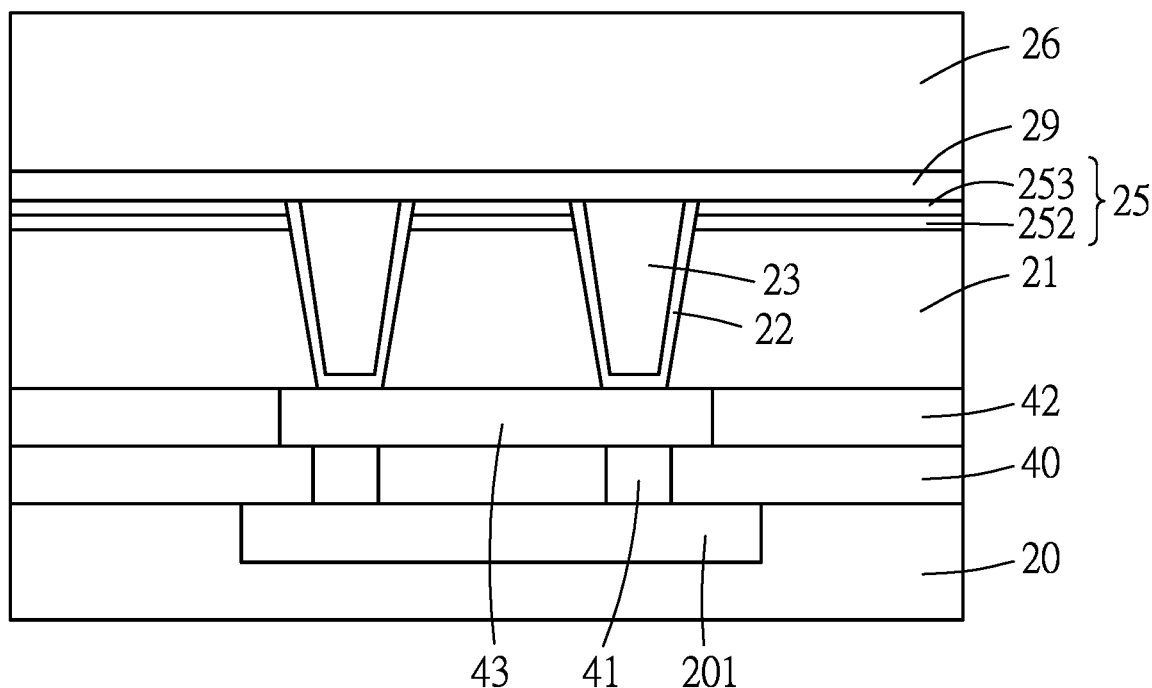

Referring to FIG. 24, after the second dielectric layer 25 is formed in FIG. 23, the blocking layer 24 (see FIG. 23) is removed, followed by forming the etch stop layer 29 over the conductive feature 23 and the second dielectric layer 25, and then forming the third dielectric layer 26 over the etch stop layer 29.

Figure 25:
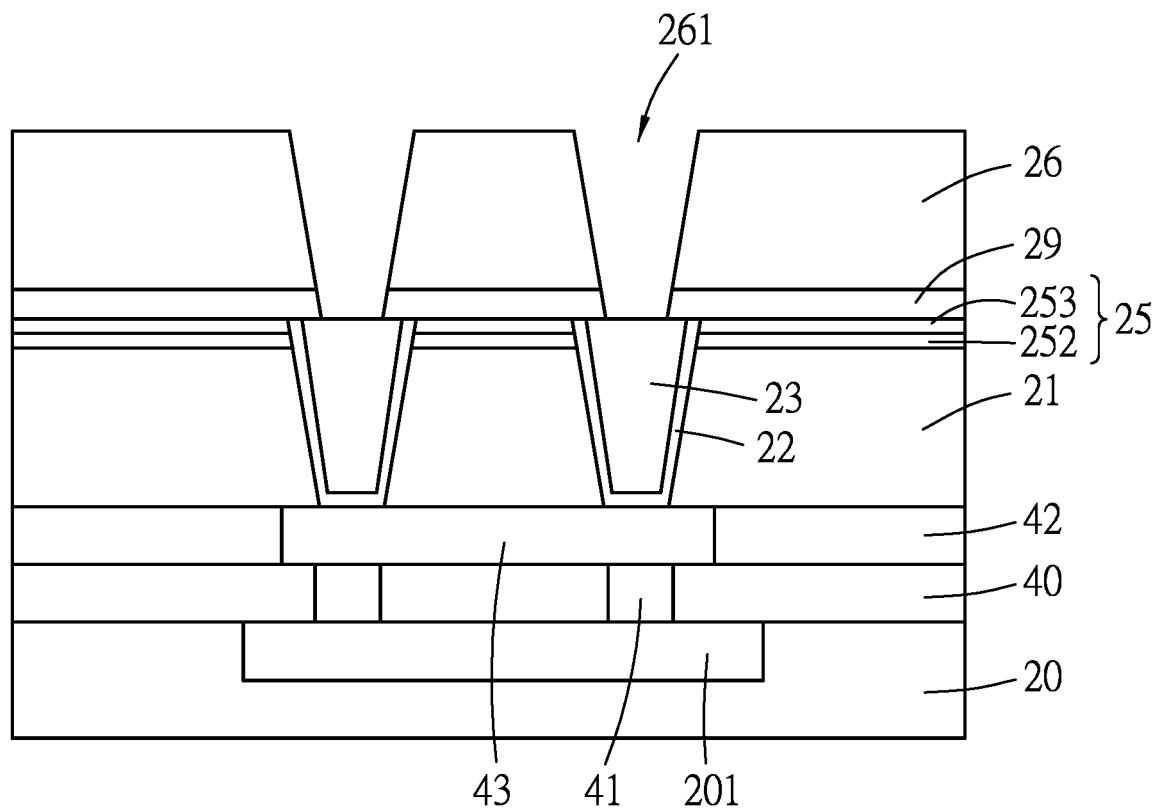
Figure 26:
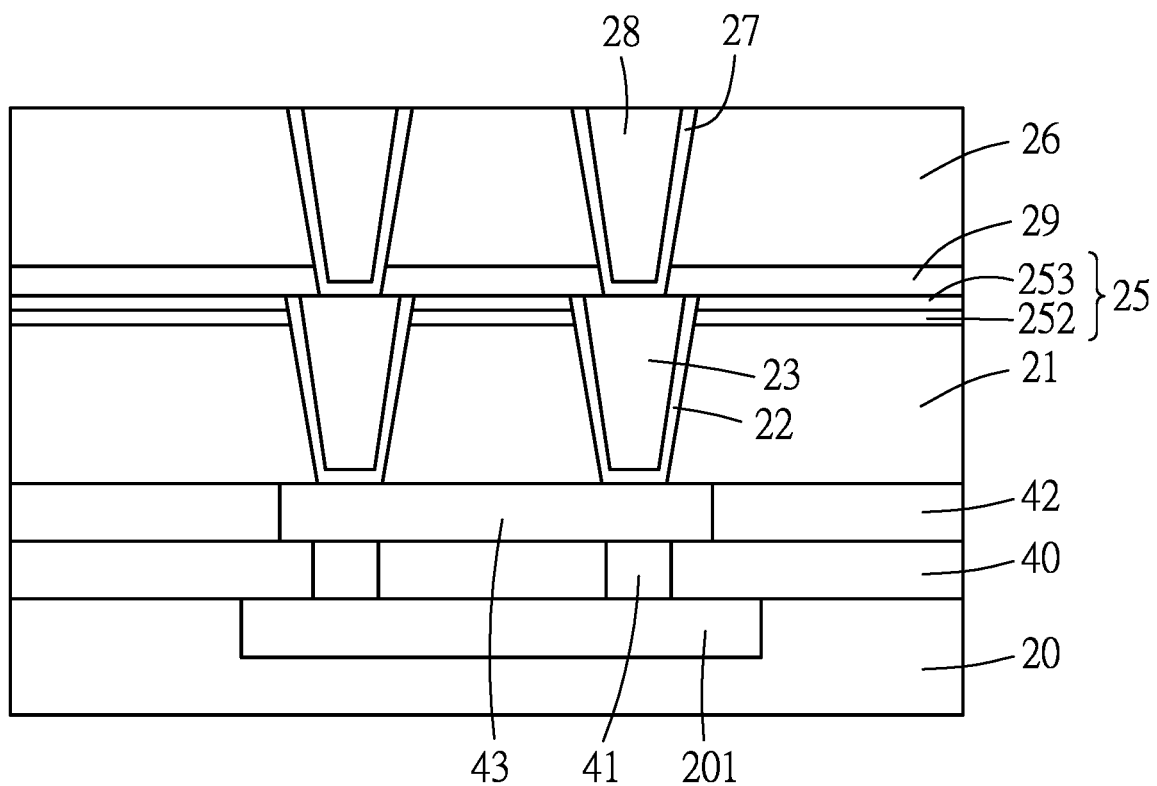

Referring to FIG. 25, after the formation of the etch stop layer 29 and the third dielectric layer 26, the third dielectric layer 26 and the etch stop layer 29 can then be patterned to form the through hole 261 with desired profile. Referring to FIG. 26, after the formation of the through hole 261 of FIG. 25, processes 330 to 334 may be conducted to form the barrier/liner layer 27 and the conductive element 28. In some embodiments, according to practical requirements, one of the liner and the barrier may be dispensed with. Alternatively, the barrier/liner layer 27 may be dispensed with.

Figure 27:
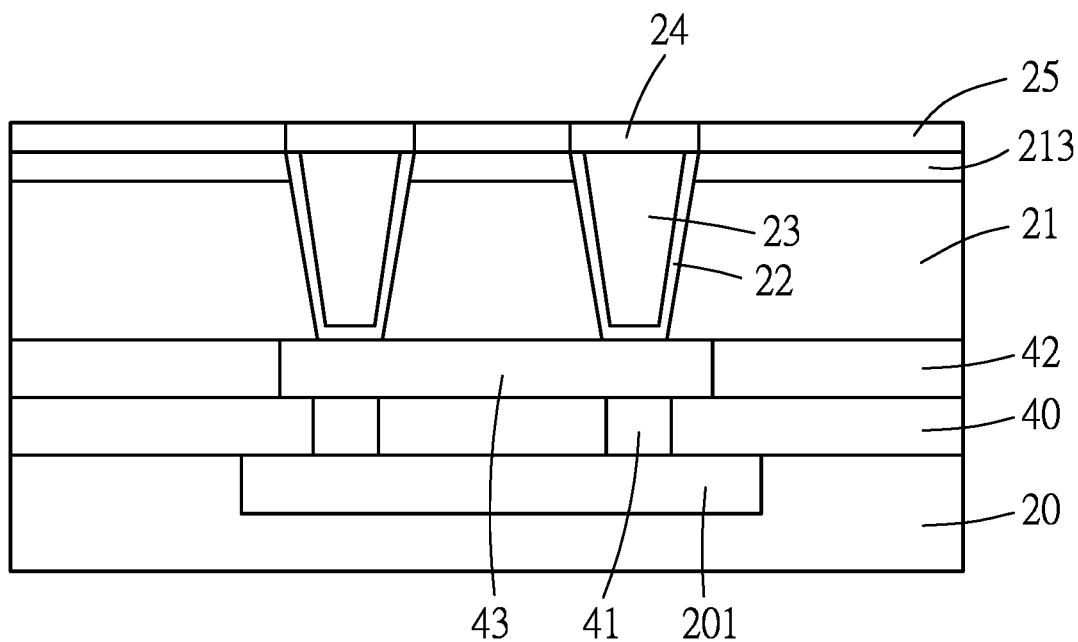
FIGS. 27 through 30 illustrate schematic views of stages in the formation of a semiconductor structure in accordance with some embodiments.

Referring to FIG. 27, in accordance with some embodiments, the plasma-damaged layer 213 of the first dielectric layer 21 may be retained, and the second dielectric layer 25 may be formed on the plasma-damaged layer 213 after the formation of the blocking layer 24 on the conductive feature 23. In some embodiments, the blocking layer 24 may be dispensed with and the second dielectric layer 25 may be directly formed on the plasma-damaged layer 213.

Figure 28:
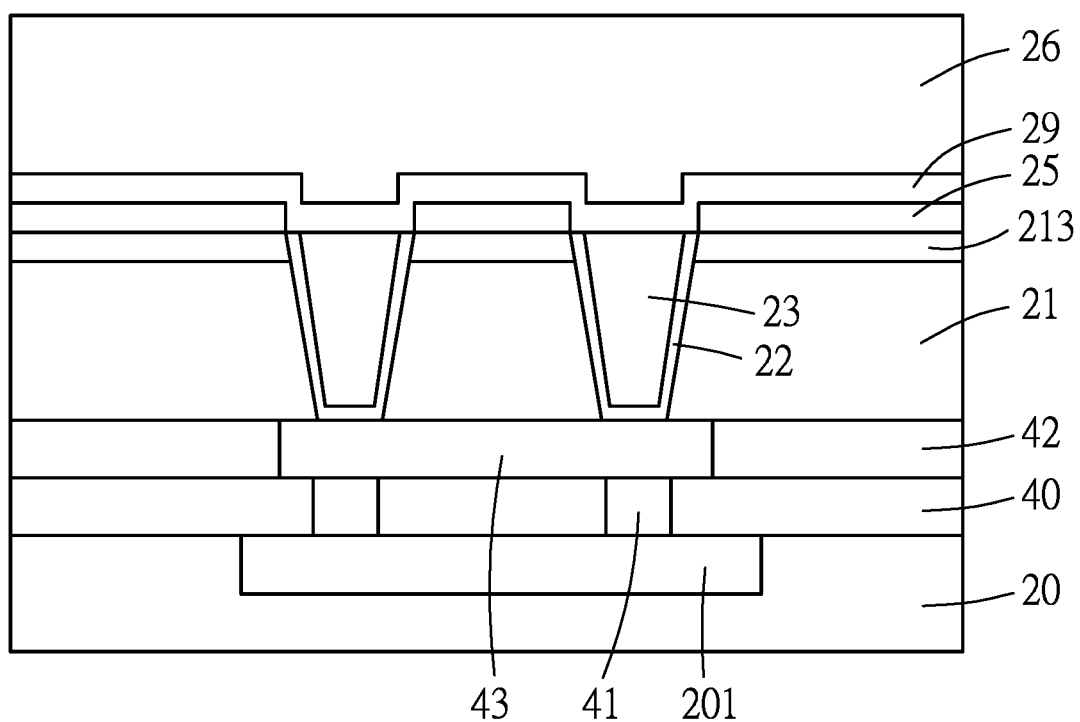
Figure 29:
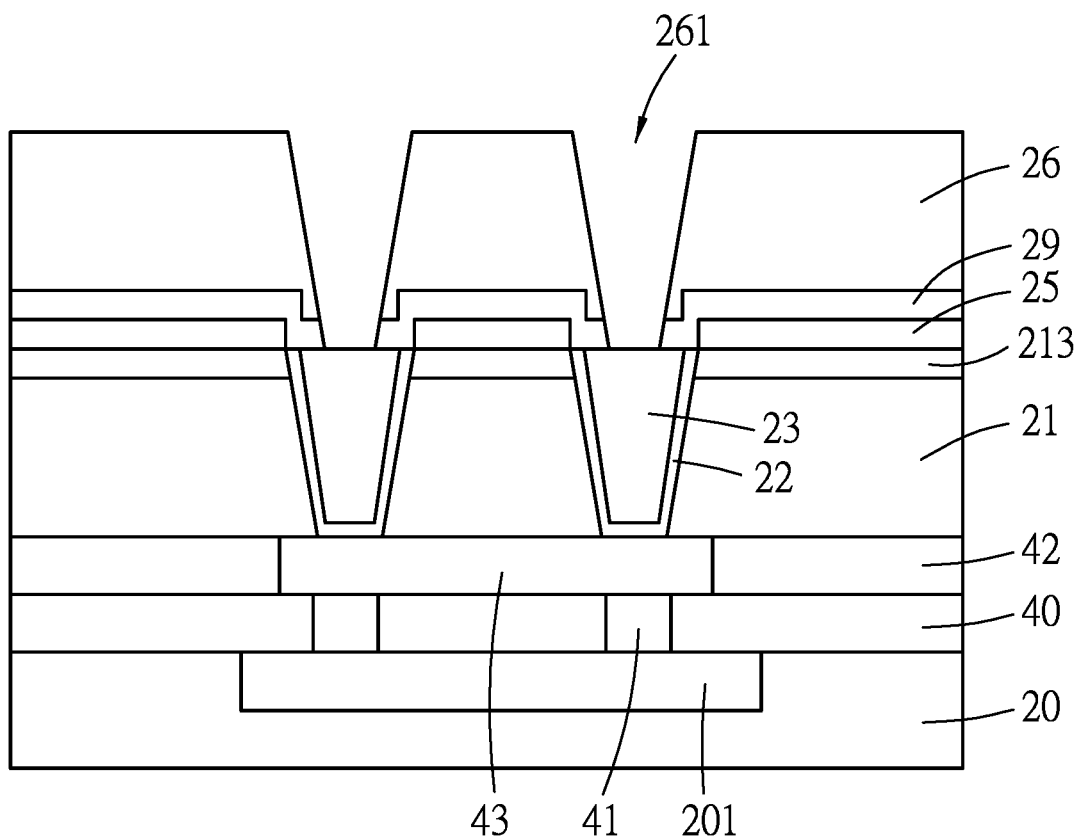
Figure 30:
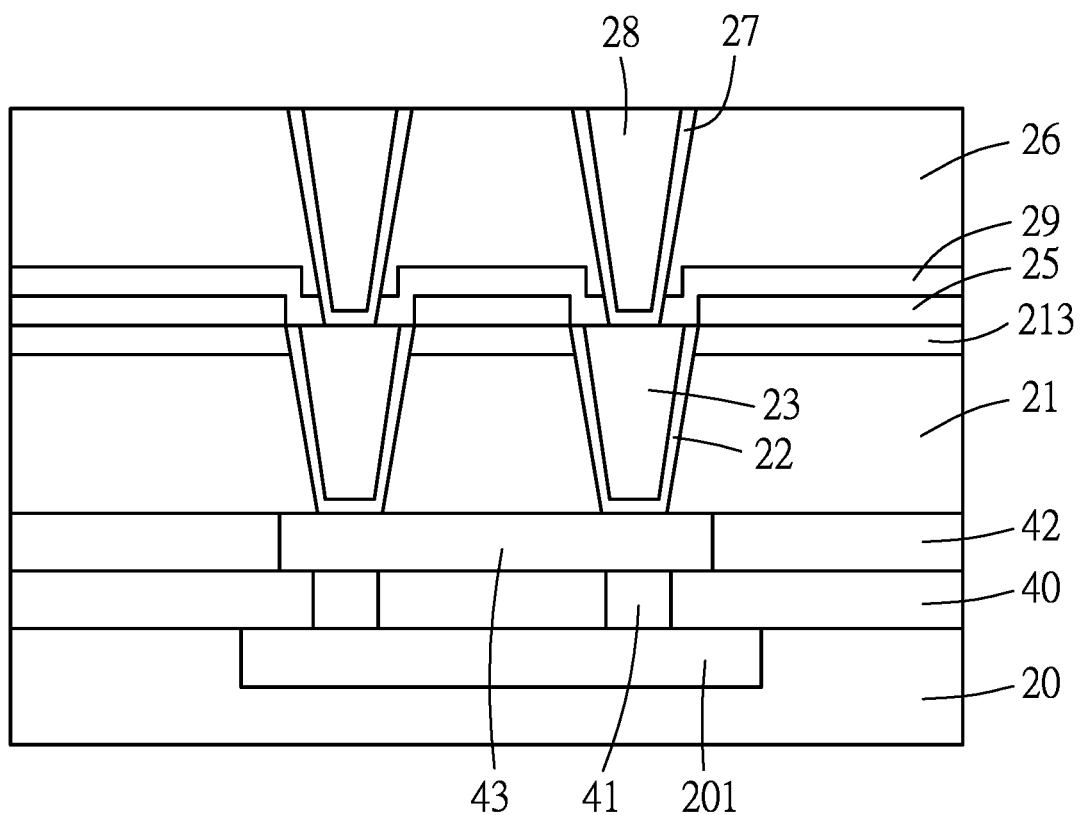

Referring to FIG. 28, after the formation of the second dielectric layer 25, the blocking layer 24 (see FIG. 27) is removed by suitable techniques. FIG. 2 also shows that, after the removal of the blocking layer 24, the etch stop layer 29 and the third dielectric layer 26 are formed. FIG. 29 shows that the through hole 261 is formed in the third dielectric layer 26. Referring to FIG. 30, processes 330 to 334 are conducted to form the barrier/liner layer 27 and the conductive element 28. In some embodiments, according to practical requirements, one of the liner and the barrier may be dispensed with. Alternatively, the barrier/liner layer 27 may be dispensed with.

Figure 31:
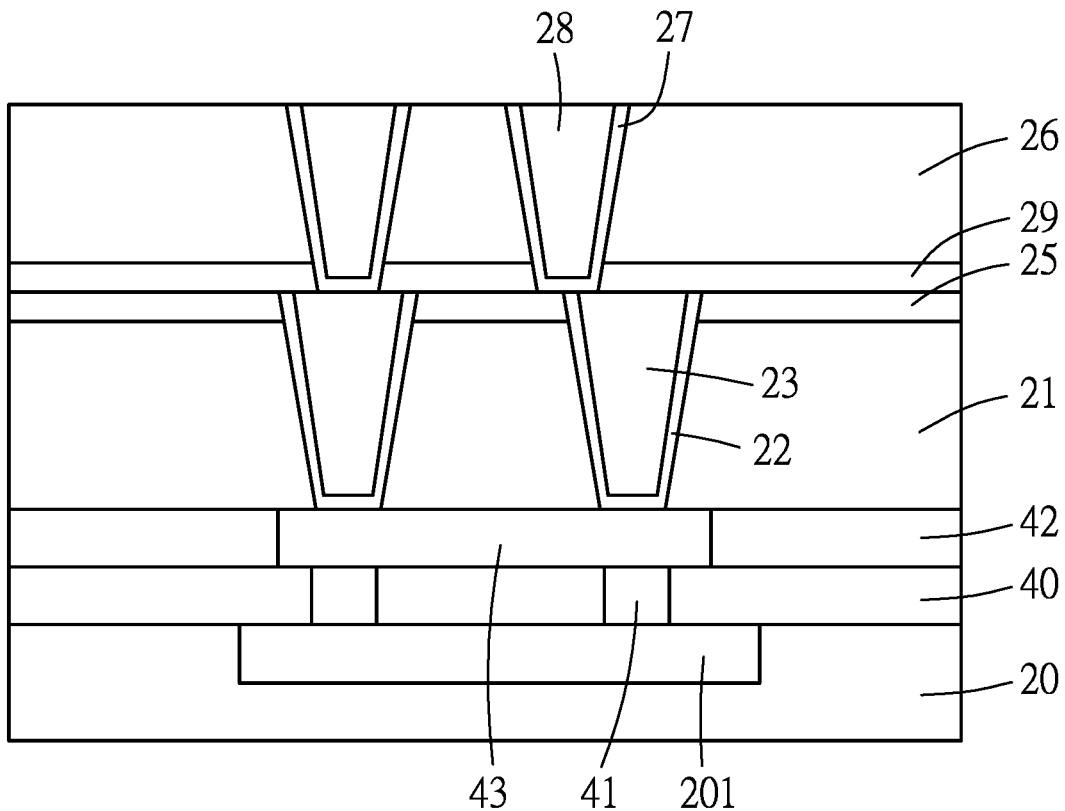
FIG. 31 illustrates an alternative to the structure depicted in FIG. 16.

Referring to FIG. 31, in some embodiments, during the formation of the through hole 261 (see FIG. 13), the through hole 261 may be slightly shifted, which may be caused by photolithographic overlay shift or other factors. The second dielectric layer 25 may prevent the through hole 261 from being formed into the first dielectric layer 21, and the subsequently formed conductive element 28 may partially land on the second dielectric layer 25 and partially land on the conductive feature 23, which still achieves electrically interconnection between the conductive feature 23 and the conductive element 28.

Figure 32:
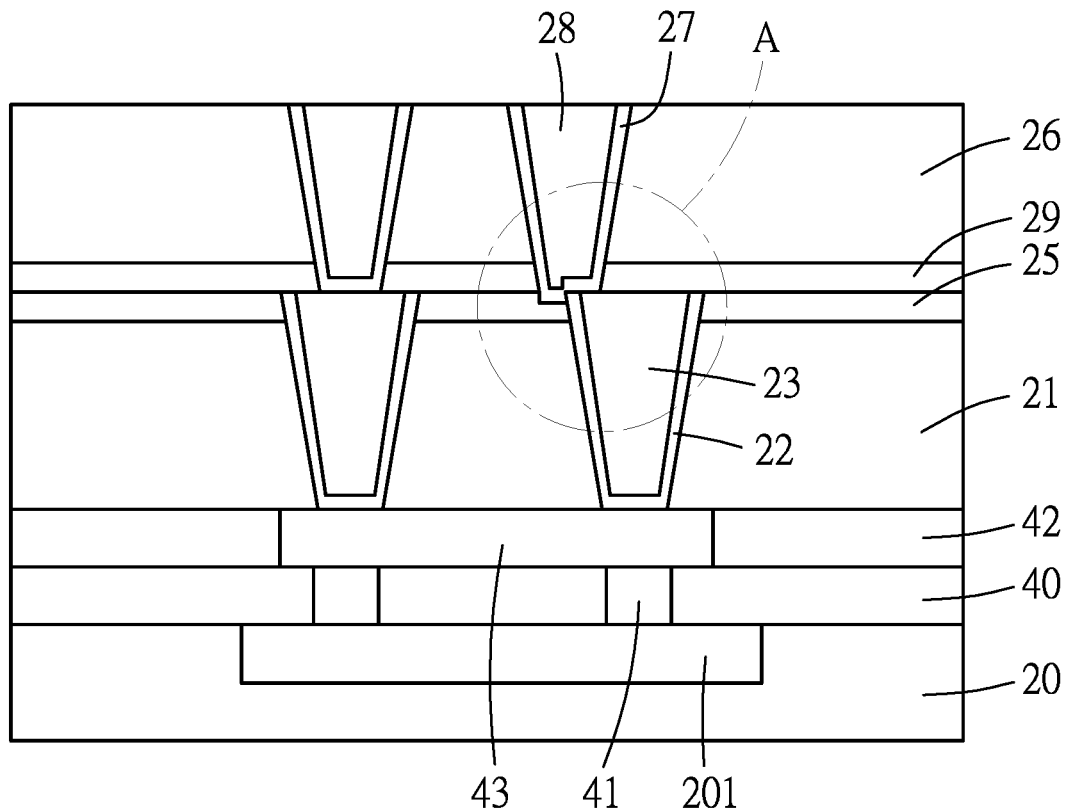
FIG. 32 illustrates an alternative to the structure depicted in FIG. 16.
Figure 33:
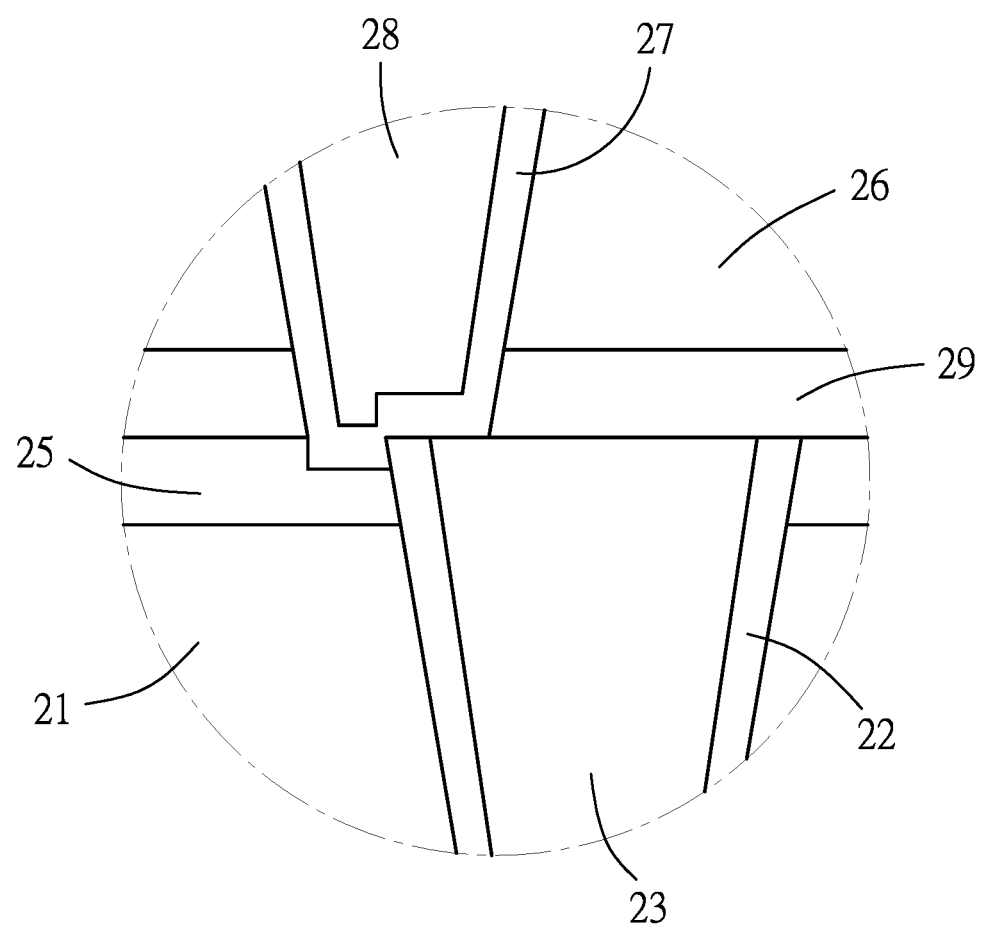
FIG. 33 is an enlarged view taken from the dotted circle A shown in FIG. 32.

Referring to FIGS. 32 and 33, in some embodiments, during the formation of the through hole 261 (see FIG. 13), the through hole 261 may be slightly shifted, such as caused by photolithographic overlay shift or other factors, and the patterning process for forming the through hole 261 may slightly etch the second dielectric layer 25. In some embodiments, although the second dielectric layer 25 is slightly etched, the through hole 261 is still prevented from being formed into the first dielectric layer 21.

The embodiments of the present disclosure have some advantageous features. By forming the first and second dielectric layers with different materials, the second dielectric layer may serve as an effective etch stop layer for preventing the later formed conductive feature from penetrating into the first dielectric layer. Moreover, by forming the second dielectric layer to have a top surface not higher than that of the conductive feature, there would not be lateral growth of the second dielectric layer directly above the conductive feature, so yield loss associated with such lateral growth is avoided. In addition, by selectively forming the blocking layer on the conductive feature and not on the first dielectric layer, the second dielectric layer can be accurately formed on the first dielectric layer and not on the conductive feature. Such feature further mitigates the abovementioned lateral growth problem. The second dielectric layer thus formed already has a desired pattern and an etching process is not required to be performed thereon, so possible overlay shift between the through hole in the third dielectric layer and the conductive feature may be eliminated. Therefore, certain issues associated with overlay shift, such as time-dependent gate oxide breakdown (TDDB) or over-etching into the underlying dielectric layer may be avoided. Furthermore, in some embodiments, during manufacturing of the semiconductor structure, removal of the plasma-damaged layer would result in a structure with lower capacitance, thereby reducing the RC time constant of the semiconductor structure.

In accordance with some embodiments, a semiconductor structure includes: a substrate with a conductive structure thereon; a first dielectric layer disposed on the substrate; a conductive feature formed in the first dielectric layer and being electrically connected to the conductive structure; and a second dielectric layer formed on the first dielectric layer and being disposed adjacent to the conductive feature. The first dielectric layer and the second dielectric layer are made of different materials.

In accordance with some embodiments, a method for making a semiconductor structure includes: providing a substrate with a conductive structure thereon; forming a first dielectric layer on the substrate, the first dielectric layer being formed with a through hole; forming a conductive feature in the through hole, the conductive feature being electrically connected to the conductive feature; selectively forming a blocking layer to cover a top surface of the conductive feature; removing a portion of the first dielectric layer to form a recess that adjoins the conductive feature; filling the recess with a second dielectric layer, the first dielectric layer and the second dielectric layer being made of different materials; and removing the blocking layer.

In accordance with some embodiments, a method for making a semiconductor structure includes: providing a first dielectric layer formed with a conductive feature; selectively forming a blocking layer to cover a top surface of the conductive feature; removing a portion of the first dielectric layer to form a recess that surrounds and exposes a top portion of the conductive feature, the top portion having the top surface of the conductive feature; filling the recess with a second dielectric layer, the second dielectric layer at least partially covering the top portion of the conductive feature, the first dielectric layer and the second dielectric layer being made of different materials; removing the blocking layer; forming a third dielectric layer on the first dielectric layer to cover the conductive feature and the second dielectric layer; forming a through hole in the third dielectric layer to expose the conductive feature; and applying a conductive material in the through hole to form a conductive element that is electrically connected to the conductive feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for making a semiconductor structure, comprising:
    providing a substrate with a conductive structure thereon;
    forming a first dielectric layer on the substrate, the first dielectric layer being formed with a through hole;
    forming a conductive feature in the through hole, the conductive feature being electrically connected to the conductive structure;
    selectively forming a blocking layer to cover a top surface of the conductive feature;
    removing a portion of the first dielectric layer to form a recess that adjoins the conductive feature;
    filling the recess with a second dielectric layer, the first dielectric layer and the second dielectric layer being made of different materials; and
    removing the blocking layer.

2. The method as claimed in claim 1, wherein the second dielectric layer has a top surface that is flush with or is lower than the top surface of the conductive feature.

3. The method as claimed in claim 1, wherein the step of filling the recess with the second dielectric layer includes forming a first sub-layer in the recess on the first dielectric layer and forming a second sub-layer in the recess on the first sub-layer, the second sub-layer having the top surface of the second dielectric layer, the first sub-layer and the second sub-layer being made of different dielectric materials.

4. The method as claimed in claim 3, wherein each of the first and second sub-layers is made of an oxide material, a nitride material, or a combination thereof.

5. The method as claimed in claim 1, wherein the second dielectric layer has a thickness ranging from 20 angstrom to 50 angstrom.

6. The method as claimed in claim 1, wherein the step of forming the conductive feature includes applying a conductive material in the through hole to form the conductive feature and removing metal oxide formed on the top surface of the conductive feature by reduction.

7. The method as claimed in claim 1, wherein the blocking layer is formed from a self-assembling monolayer material including a head group which contains phosphorus, sulfur, nitrogen, or combinations thereof.

8. A method for making a semiconductor structure, comprising:
    providing a first dielectric layer that is formed with a conductive feature;
    selectively forming a blocking layer to cover a top surface of the conductive feature;
    removing a portion of the first dielectric layer to form a recess that surrounds and exposes a top portion of the conductive feature, the top portion having the top surface of the conductive feature;
    filling the recess with a second dielectric layer, the second dielectric layer at least partially covering the top portion of the conductive feature, the first dielectric layer and the second dielectric layer being made of different materials;
    removing the blocking layer;
    forming a third dielectric layer on the first dielectric layer to cover the conductive feature and the second dielectric layer;
    forming a through hole in the third dielectric layer to expose the conductive feature; and
    applying a conductive material in the through hole to form a conductive element that is electrically connected to the conductive feature.

9. The method as claimed in claim 8, wherein the second dielectric layer has a top surface that is flush with or is lower than the top surface of the conductive feature.

10. The method as claimed in claim 8, wherein the second dielectric layer includes a first sub-layer and a second sub-layer that are made of dielectric materials different from each other.

11. The method as claimed in claim 8, wherein the second dielectric layer has a thickness ranging from 20 angstrom to 50 angstrom.

12. The method as claimed in claim 8, wherein:
    after forming the first dielectric layer and before forming the blocking layer, applying a reductive plasma to the first dielectric layer and the conductive feature such that a portion of the first dielectric layer is converted into a plasma-damaged layer; and
    in the step of removing a portion of the first dielectric layer, the plasma-damaged layer is removed.

13. A method for making a semiconductor structure, comprising:
    providing a substrate with a conductive structure thereon;
    forming a first dielectric layer on the substrate, the first dielectric layer being formed with a through hole;
    forming a conductive feature in the through hole, the conductive feature being electrically connected to the conductive structure;
    selectively forming a blocking layer to cover a top surface of the conductive feature;
    selectively forming a second dielectric layer on the first dielectric layer so as to expose the blocking layer, the first dielectric layer and the second dielectric layer being made of different materials; and
    removing the blocking layer.

14. The method as claimed in claim 13, further comprising, after formation of the conductive feature and before formation of the blocking layer, subjecting the conductive feature and the first dielectric layer to a plasma treatment, such that a top portion of the first dielectric layer is formed into a plasma-damaged layer.

15. The method as claimed in claim 14, further comprising, before formation of the second dielectric layer, removing the plasma-damaged layer to form a recess that adjoins the conductive feature.

16. The method as claimed in claim 15, wherein the second dielectric layer is formed to fill the recess.

17. The method as claimed in claim 16, wherein the second dielectric layer has a top surface that is flush with the top surface of the conductive feature.

18. The method as claimed in claim 16, wherein the second dielectric layer has a top surface that is lower than the top surface of the conductive feature.

19. The method as claimed in claim 16, wherein formation of the second dielectric layer includes forming a first sub-layer in the recess and on the first dielectric layer and forming a second sub-layer in the recess and on the first sub-layer, the second sub-layer having the top surface of the second dielectric layer, the first sub-layer and the second sub-layer being made of different dielectric materials.

20. The method as claimed in claim 14, wherein the second dielectric layer is formed on the plasma-damaged layer.

* * * * *